(12) United States Patent
Koezuka et al.

(10) Patent No.: US 9,318,577 B2
(45) Date of Patent: Apr. 19, 2016

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Junichi Koezuka, Tochigi (JP); Satoshi Shinohara, Atsugi (JP); Miki Suzuki, Yokohama (JP); Hideto Ohnuma, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/284,857

(22) Filed: May 22, 2014

(65) Prior Publication Data

US 2014/0256096 A1    Sep. 11, 2014

Related U.S. Application Data

(62) Division of application No. 13/315,322, filed on Dec. 9, 2011, now Pat. No. 8,766,361.

(30) Foreign Application Priority Data

Dec. 16, 2010 (JP) .................................. 2010-280670

(51) Int. Cl.
*H01L 29/66* (2006.01)
*H01L 27/12* (2006.01)
*H01L 29/786* (2006.01)

(52) U.S. Cl.
CPC ...... *H01L 29/66772* (2013.01); *H01L 27/1288* (2013.01); *H01L 29/66492* (2013.01); *H01L 29/78624* (2013.01)

(58) Field of Classification Search
CPC ................... H01L 29/42384; H01L 29/66757; H01L 29/78621; H01L 29/4908; H01L 29/66492; H01L 29/66772; H01L 21/76254; H01L 21/02532; H01L 21/02675; H01L 27/1292
See application file for complete search history.

(56) References Cited

U.S. PATENT DOCUMENTS 6,316,787 B1    11/2001    Ohtani
6,429,485 B1    8/2002    Ha et al.
(Continued)

FOREIGN PATENT DOCUMENTS

JP    61-026264 A    2/1986
JP    07-142739 A    6/1995
(Continued)

*Primary Examiner* — Marc Armand
*Assistant Examiner* — Christina Sylvia
(74) *Attorney, Agent, or Firm* — Robinson Intellectual Property Law Office; Eric J. Robinson

(57) ABSTRACT

A semiconductor device is provided, which includes a single crystal semiconductor layer formed over an insulating surface and having a source region, a drain region, and a channel formation region, a gate insulating film covering the single crystal semiconductor layer and a gate electrode overlapping with the channel formation region with the gate insulating film interposed therebetween. In the semiconductor device, at least the drain region of the source and drain regions includes a first impurity region adjacent to the channel formation region and a second impurity region adjacent to the first impurity region. A maximum of an impurity concentration distribution in the first impurity region in a depth direction is closer to the insulating surface than a maximum of an impurity concentration distribution in the second impurity region in a depth direction.

25 Claims, 16 Drawing Sheets

(56) References Cited

U.S. PATENT DOCUMENTS

| | | |
|---|---|---|
| 6,479,867 B2 | 11/2002 | Itoga et al. |
| 6,501,098 B2 | 12/2002 | Yamazaki |
| 6,515,336 B1 | 2/2003 | Suzawa et al. |
| 6,521,912 B1 * | 2/2003 | Sakama ............... G02B 27/017 257/411 |
| 6,593,592 B1 | 7/2003 | Yamazaki et al. |
| 6,884,664 B2 | 4/2005 | Fujimoto et al. |
| 6,955,953 B2 | 10/2005 | Yamazaki et al. |
| 7,183,144 B2 | 2/2007 | Fujimoto et al. |
| 7,223,643 B2 * | 5/2007 | Ohnuma ........... H01L 21/28114 257/E21.314 |
| 7,535,024 B2 * | 5/2009 | Oue et al. ........................ 257/72 |
| 7,588,970 B2 | 9/2009 | Ohnuma et al. |
| 7,807,516 B2 | 10/2010 | Ohnuma et al. |
| 7,914,971 B2 | 3/2011 | Ohnuma et al. |
| 2001/0041392 A1 * | 11/2001 | Suzawa et al. ................ 438/149 |
| 2002/0074550 A1 | 6/2002 | Itoga et al. |
| 2004/0029338 A1 | 2/2004 | Yamazaki et al. |
| 2004/0238820 A1 | 12/2004 | Sakama et al. |
| 2004/0252250 A1 * | 12/2004 | Yang et al. ...................... 349/43 |
| 2007/0087616 A1 * | 4/2007 | Sakakura et al. ............. 439/395 |
| 2010/0087045 A1 * | 4/2010 | Shimomura et al. .......... 438/458 |
| 2010/0230754 A1 | 9/2010 | Isobe et al. |

FOREIGN PATENT DOCUMENTS

| | | |
|---|---|---|
| JP | 10-256557 A | 9/1998 |
| JP | 2000-284722 A | 10/2000 |
| JP | 2002-185008 A | 6/2002 |
| JP | 2002-203862 A | 7/2002 |

* cited by examiner

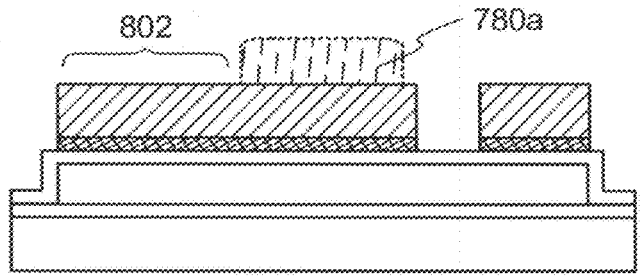
FIG. 3A
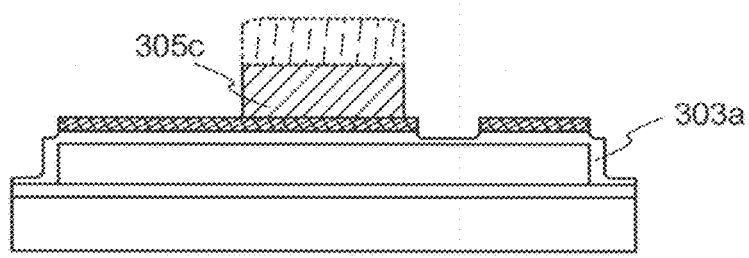
FIG. 3B
FIG. 3C
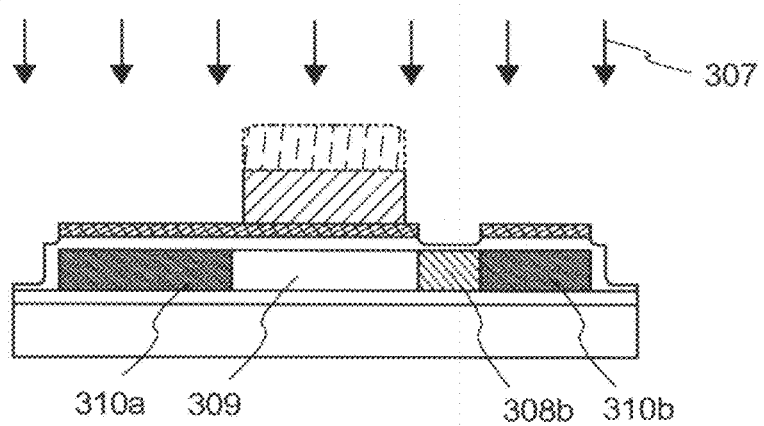
FIG. 3D
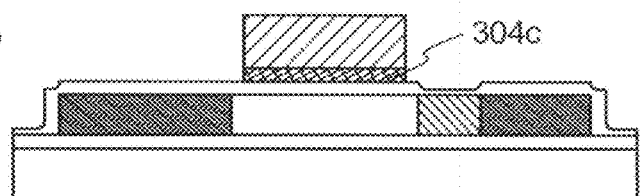
FIG. 3E
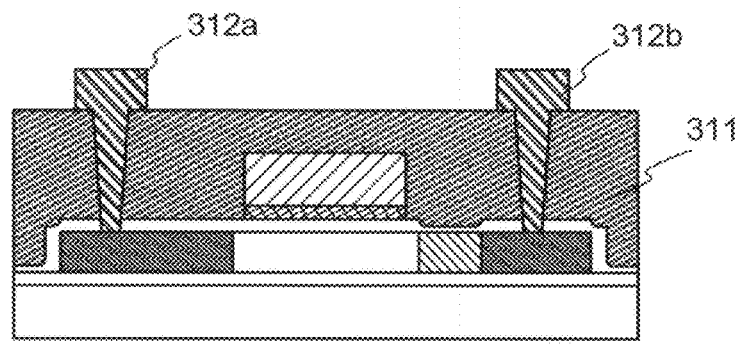

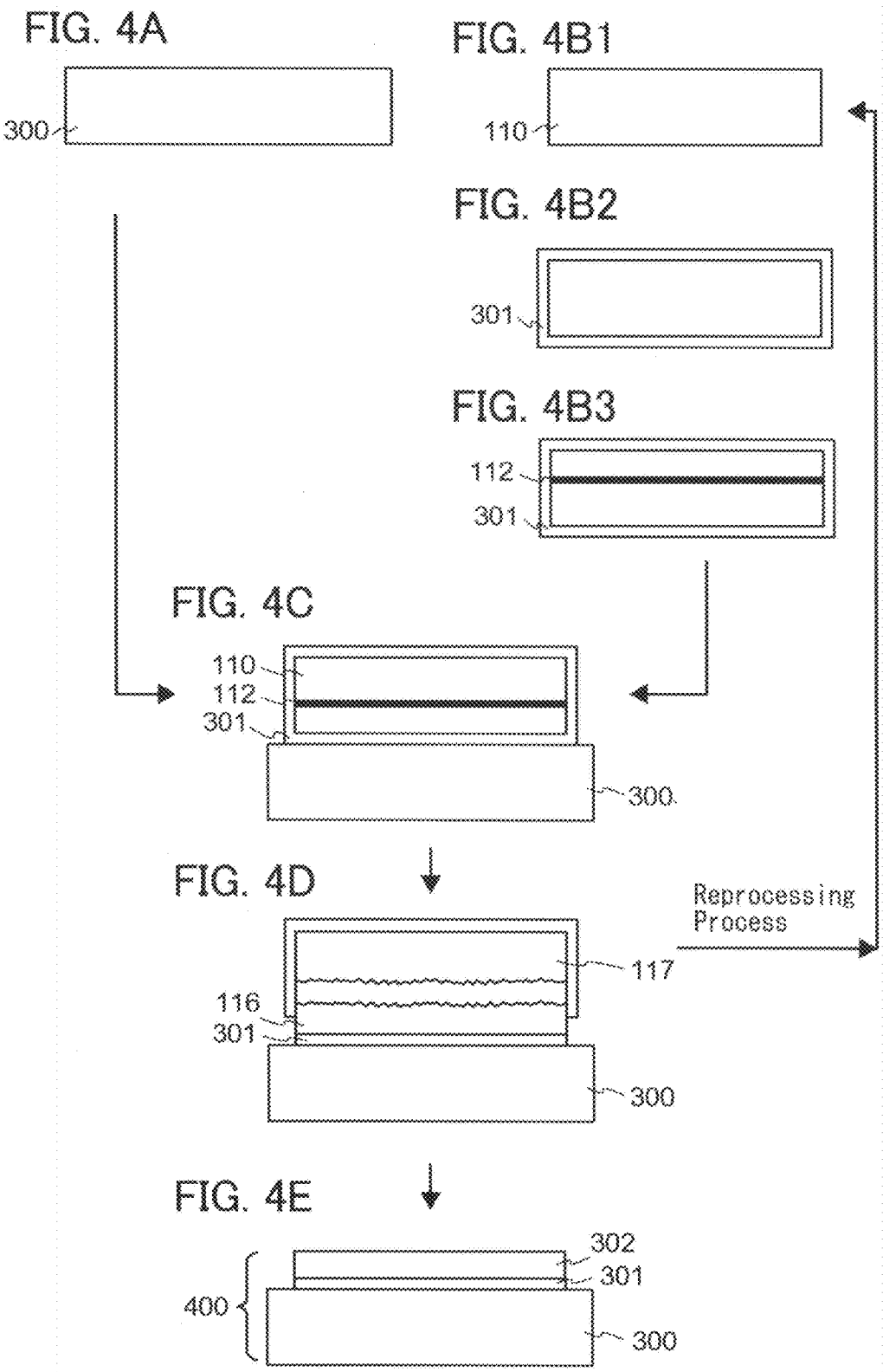

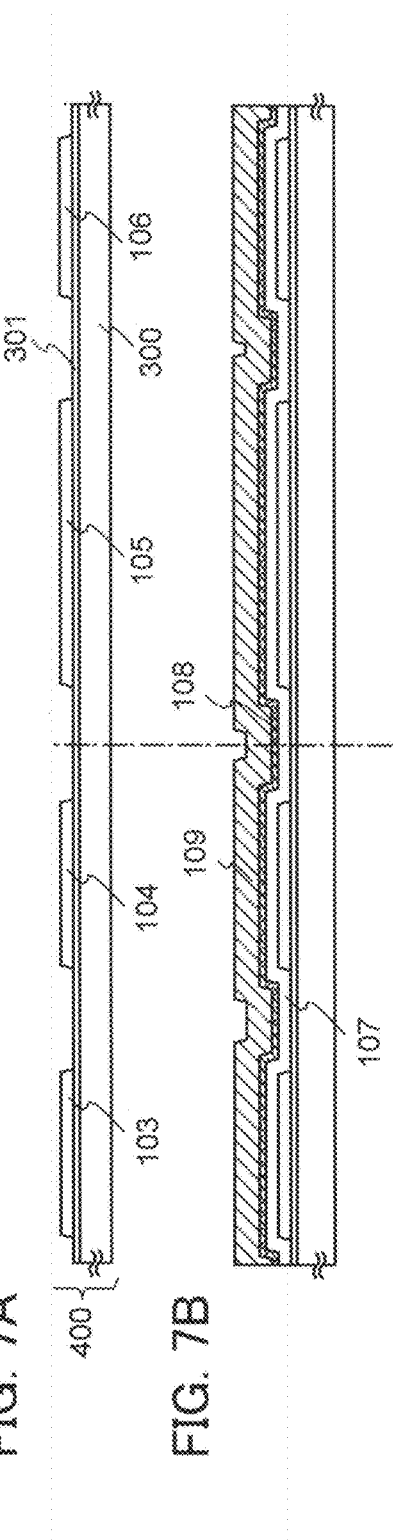

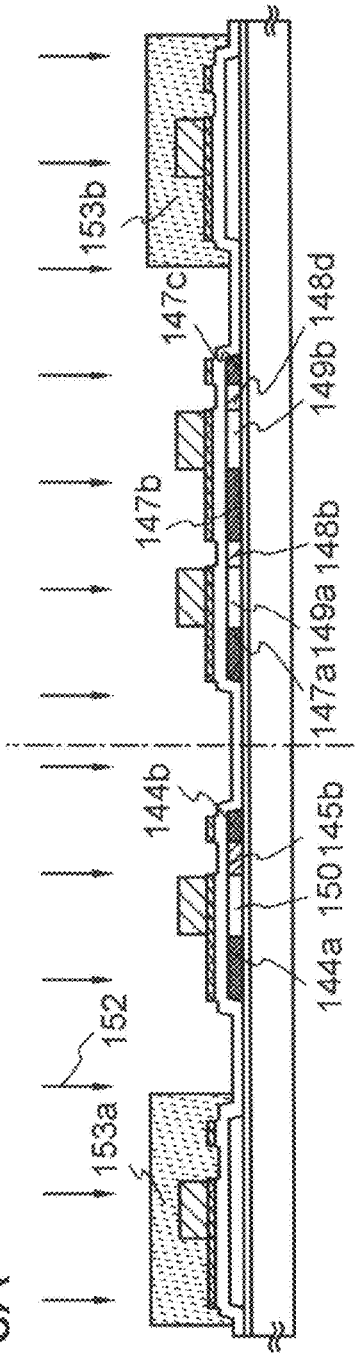
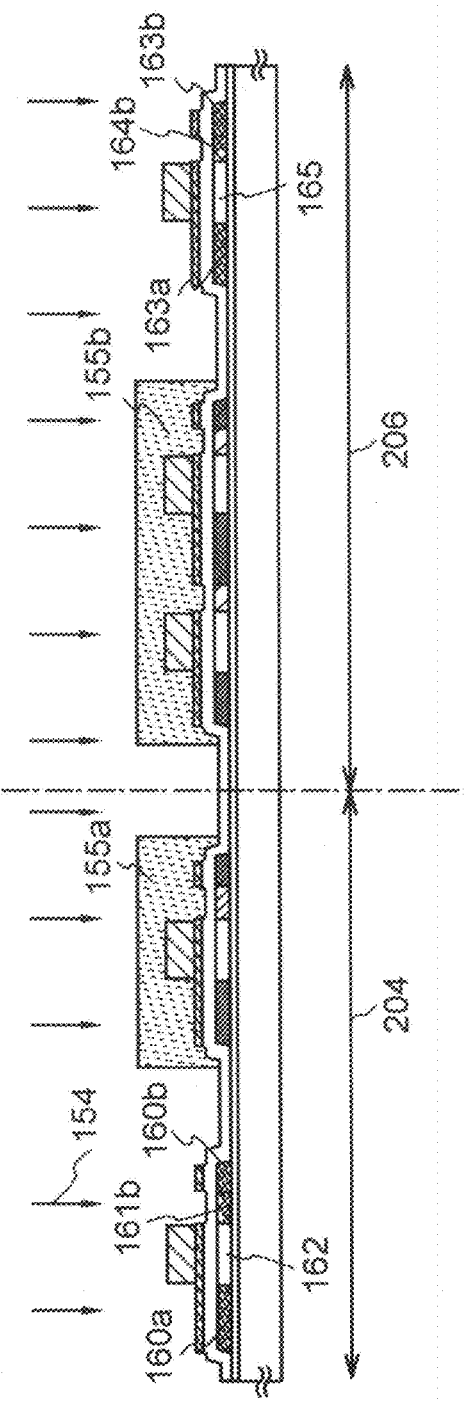

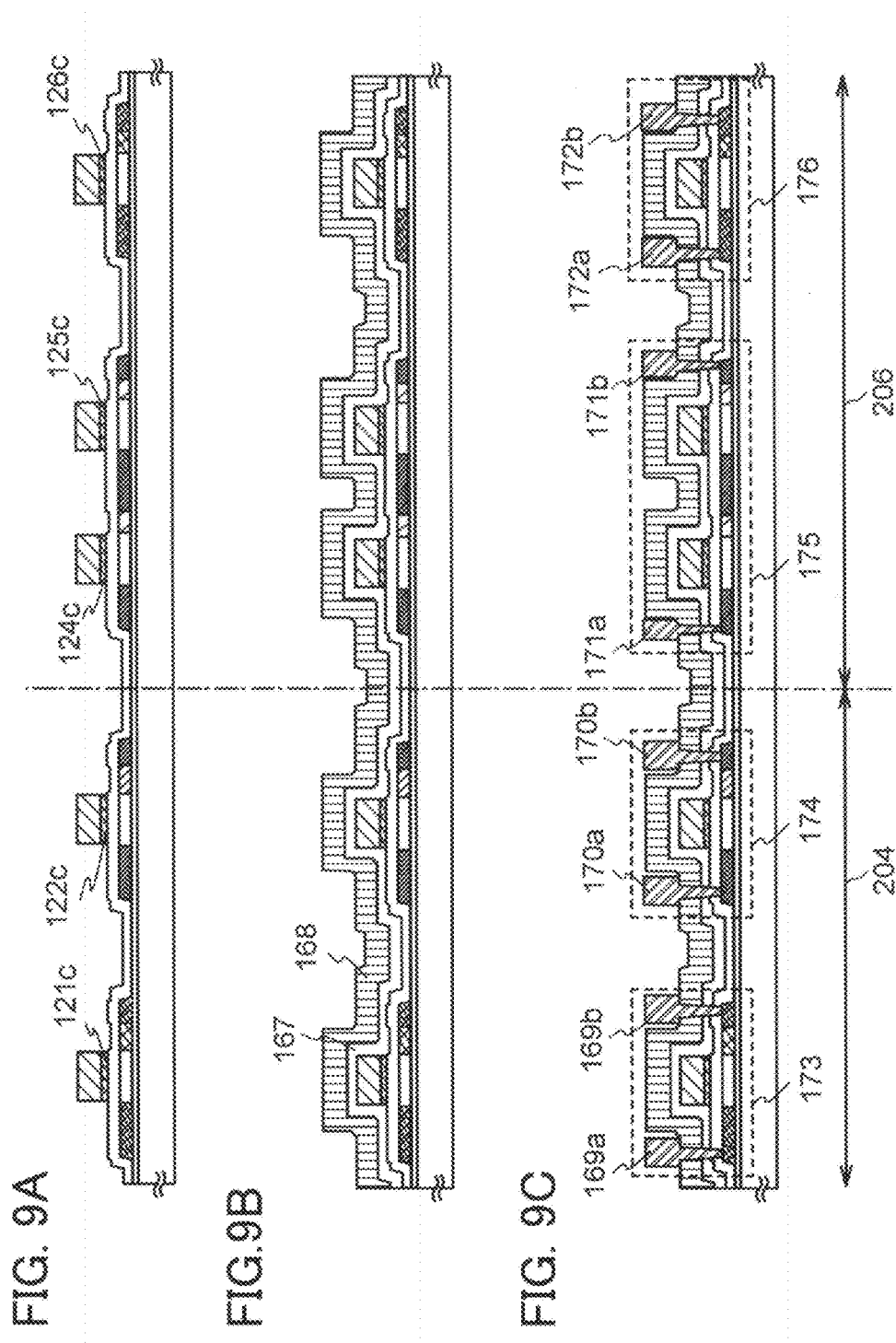

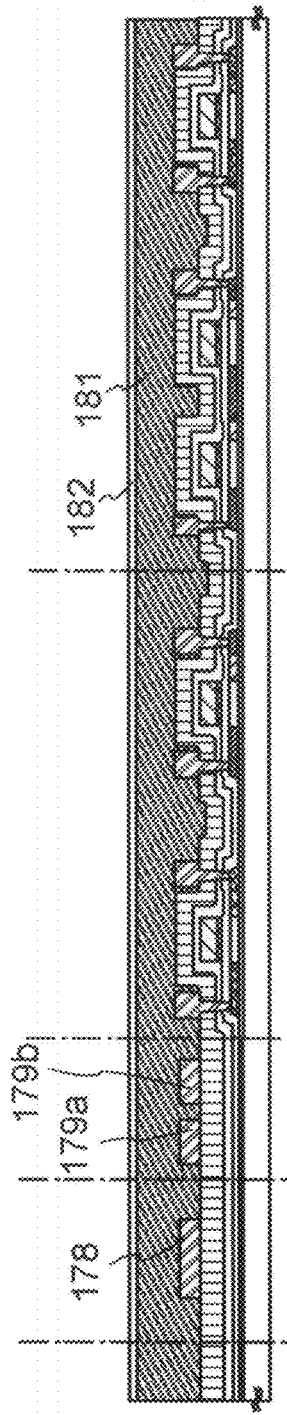
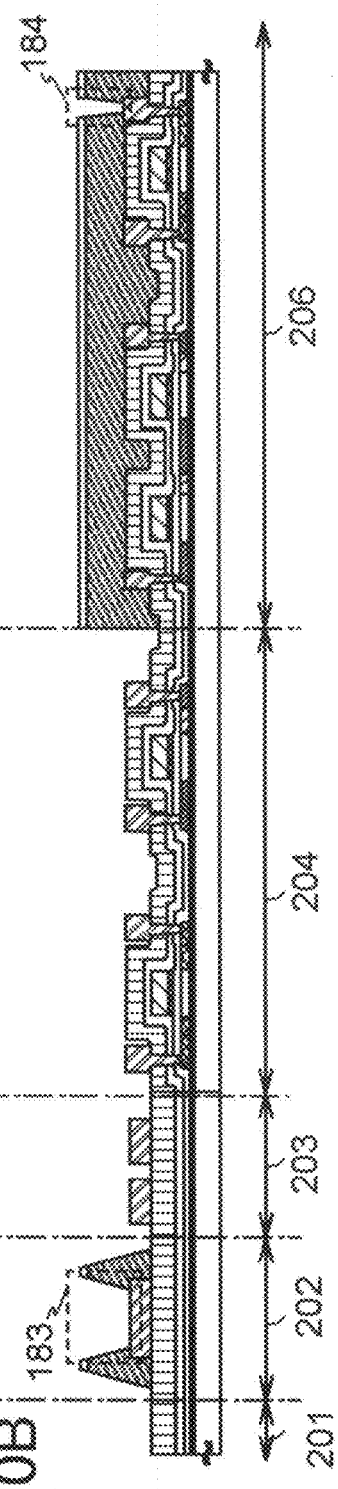
FIG. 10A
FIG. 10B

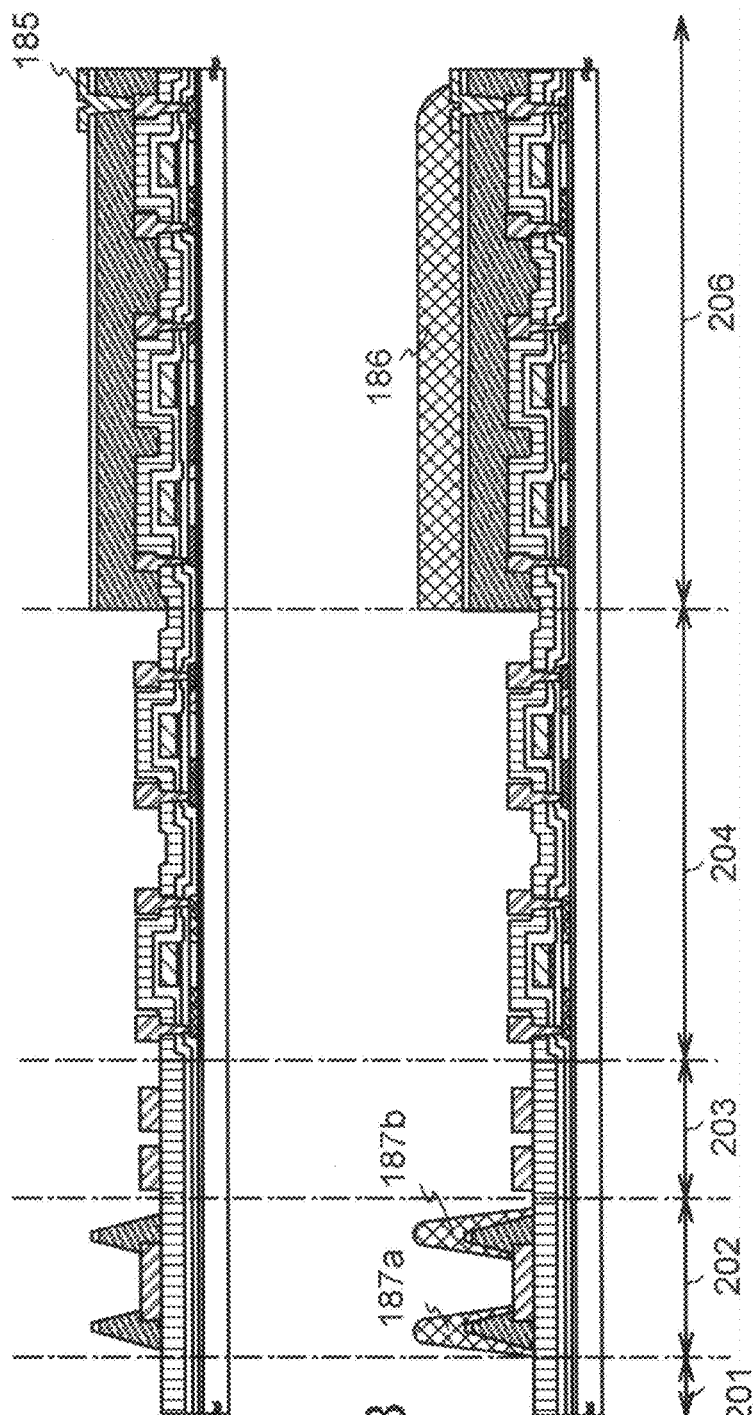

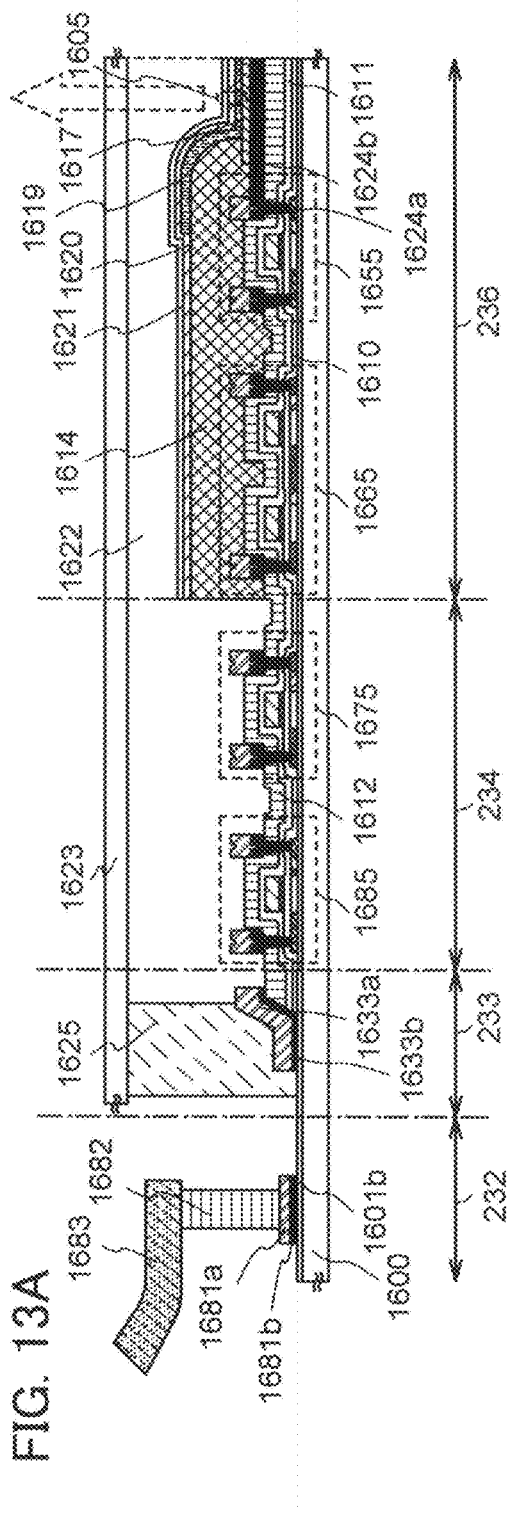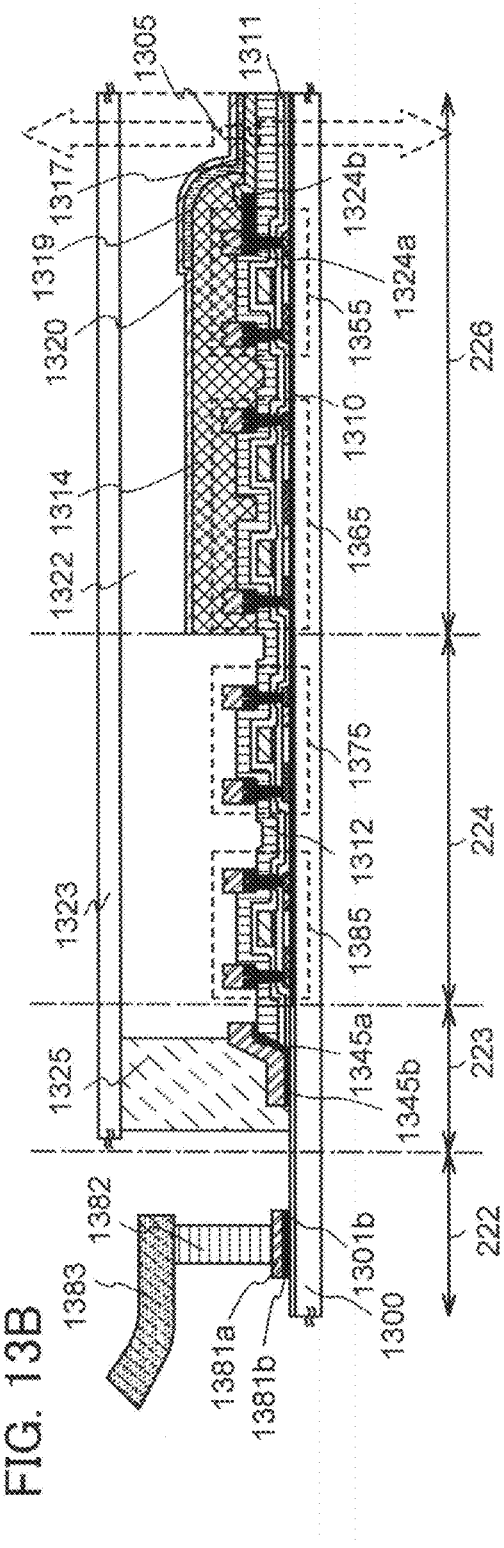
FIG. 13A
FIG. 13B

SEMICONDUCTOR DEVICE AND METHOD FOR MANUFACTURING SEMICONDUCTOR DEVICE

BACKGROUND OF THE INVENTION

1. Field of the Invention

An embodiment of the present invention relates to a semiconductor device and a method for manufacturing the semiconductor device.

2. Description of the Related Art

Different characteristics are required for transistors that are used in semiconductor devices, display devices, and the like, depending on the purpose or function of the semiconductor devices, the display devices, and the like. In order to satisfy the requirements, it is important to control characteristics of transistors, and a technique of manufacturing transistors having characteristics suited for their intended use has been researched.

As a transistor structure for reducing off-state current, a technique to provide a lightly doped drain (LDD) structure is known. In the LDD structure, a region to which an impurity element is added at a low concentration is provided between a channel formation region and a source region or a drain region, and that region is referred to as an LDD region.

There has been a report of a technique to form the LDD structure in a semiconductor layer in a self-aligned manner through, for example, a method in which stacked conductive layers to be a gate electrode are processed into a tapered shape or the like and an impurity element is added using the shape (e.g., see Patent Document 1).

REFERENCE

[Patent Document 1] Japanese Published Patent Application No. 2002-203862

SUMMARY OF THE INVENTION

The LDD structure is significantly effective in reducing off-state current, whereas it has the problem of a decrease in on-state current of a transistor.

In view of the above problem, it is an object of one embodiment of the disclosed invention to provide a semiconductor device with reduced off-state current. Alternatively, it is an object to provide a method for manufacturing the semiconductor device with reduced off-state current through a simple process.

In one embodiment of the present invention, semiconductor regions having peaks of impurity concentration at different positions are formed at the same time in at least a drain region of a source and the drain regions. Details thereof are as follows.

One embodiment of the present invention is a semiconductor device including a single crystal semiconductor layer formed over an insulating surface and having a source region, a drain region, and a channel formation region, a gate insulating film covering the single crystal semiconductor layer, a gate electrode provided so as to overlap with the channel formation region with the gate insulating film interposed therebetween, a source electrode connected to the source region, and a drain electrode connected to the drain region. At least the drain region of the source and drain regions includes a first impurity region adjacent to the channel formation region and a second impurity region adjacent to the first impurity region. A maximum of an impurity concentration distribution in the first impurity region in a depth direction is closer to the insulating surface than a maximum of an impurity concentration distribution in the second impurity region in a depth direction. The drain electrode is connected to a portion of the second impurity region of the drain region.

The aforementioned gate electrode may include a first conductive layer provided in contact with the gate insulating film and a second conductive layer stacked over the first conductive layer.

The thickness of the aforementioned first conductive layer may be in the range from 20 nm to 100 nm, and the thickness of the second conductive layer may be in the range from 100 nm to 400 nm.

The thickness of a portion of the aforementioned gate insulating film overlapping with the first impurity region may be smaller than the thickness of a portion of the gate insulating film overlapping with the second impurity region.

Another embodiment of the present invention is a method for manufacturing a semiconductor device, including the steps of: forming a gate insulating film over a single crystal semiconductor layer; forming a first conductive film over the gate insulating film; forming a second conductive film over the first conductive film; forming a first mask layer in a first region over the second conductive film and forming a second mask layer in a second region over the second conductive film away from the first region by using a light exposure mask capable of transmitting light with a plurality of intensities or a light exposure mask having a light-intensity reducing function; forming a first conductive layer and a second conductive layer in contact with the first conductive layer in the first region over the gate insulating film, and a third conductive layer in the second region over the gate insulating film through etching using the first mask layer and the second mask layer; adding an impurity element imparting one conductivity type to the single crystal semiconductor layer by using the first conductive layer, the second conductive layer, and the third conductive layer as a mask; and etching the third conductive layer.

The aforementioned single crystal semiconductor layer may be manufactured by irradiating a semiconductor substrate with accelerated ions to form an embrittled region in the semiconductor substrate, bonding the semiconductor substrate and a substrate to each other with an insulating layer interposed therebetween, and separating the semiconductor substrate along the embrittled region by heat treatment.

The aforementioned first mask layer may have a first portion and a second portion and may be formed such that the thickness of the first portion is smaller than the thickness of the second portion.

The first mask layer may be formed such that the percentage of the thickness of the first portion of the first mask layer to the thickness of the second portion of the first mask layer is 50% or less.

The aforementioned second mask layer may be formed such that the thickness of the second mask layer is equal to or substantially equal to the thickness of the first portion of the first mask layer.

The first conductive layer, the second conductive layer, and the third conductive layer may be formed such that the thickness of the first conductive layer and the thickness of the third conductive layer are each in the range from 20 nm to 100 nm and the thickness of the second conductive layer is in the range from 100 nm to 400 nm.

In this specification and the like, the term "single crystal" means a crystal in which, when a certain crystal axis is focused on, the crystal axis is oriented in the same direction in any portion of a sample. That is, the single crystal includes a crystal in which the direction of crystal axis is uniform as described above even when it includes a crystal defect, a dangling bond, or the like.

Further, in this specification and the like, the term "semiconductor device" means all devices which can operate by utilizing semiconductor characteristics. For example, a display device and an integrated circuit are included in the category of the semiconductor device. Furthermore, in this specification and the like, the display device includes a light-emitting display device, a liquid crystal display device, and a display device including an electrophoretic element. The light-emitting display device includes a light-emitting element, and the liquid crystal display device includes a liquid crystal element. The light-emitting element includes in its category an element whose luminance is controlled by a current or a voltage, and specifically includes an inorganic electroluminescent (EL) element, an organic EL element, and the like.

Note that the term such as "over" in this specification and the like does not necessarily mean that a component is placed "directly on" another component. For example, the expression "a gate electrode over a gate insulating film" does not exclude the case where another component is placed between the gate insulating film and the gate electrode. The same applies to the term "below".

In addition, the term "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Note that the term "electrically connected" in this specification and the like includes the case where components are connected through an "object having any electric function". There is no particular limitation on an object having any electric function as long as electric signals can be transmitted and received between components that are connected through the object.

Examples of an "object having any electric function" are a switching element such as a transistor, a resistor, an inductor, a capacitor, and elements with a variety of functions as well as an electrode and a wiring.

The present invention makes it possible to form semiconductor regions having peaks of impurity concentration at different positions at the same time in at least a drain region of a source and the drain regions. Accordingly, a reduction in the number of masks and a simplification of a manufacturing process can be achieved, and an increase in productivity can be realized. In addition, when at least the drain region of the source and drain regions includes semiconductor regions having peaks of impurity concentration at different positions, a transistor with reduced off-state current can be manufactured. Thus, by using the transistor, a highly reliable semiconductor device can be provided.

BRIEF DESCRIPTION OF THE DRAWINGS

FIGS. 3A to 3E are cross-sectional views illustrating a method for manufacturing a semiconductor device of the present invention.

FIGS. 4A, 4B-1 to 4B-3, and 4C to 4E are cross-sectional views illustrating a method for manufacturing a semiconductor substrate used for a semiconductor device of the present invention.

FIGS. 7A to 7D are cross-sectional views illustrating a method for manufacturing a display device of the present invention.

FIGS. 8A and 8B are cross-sectional views illustrating a method for manufacturing a display device of the present invention.

FIGS. 9A to 9C are cross-sectional views illustrating a method for manufacturing a display device of the present invention.

FIGS. 10A and 10B are cross-sectional views illustrating a method for manufacturing a display device of the present invention.

FIGS. 11A and 11B are cross-sectional views illustrating a method for manufacturing a display device of the present invention.

FIGS. 13A and 13B are each a cross-sectional view of a display device of the present invention.

DETAILED DESCRIPTION OF THE INVENTION

Figure 1A:
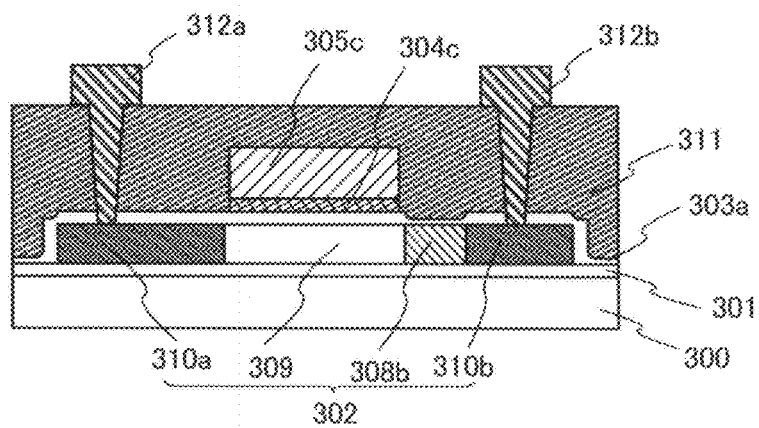
FIGS. 1A to 1D illustrate a cross-sectional view, a top view, and impurity concentration distributions of a semiconductor device of the present invention.

Embodiments and examples will be described in detail below with reference to the drawings. Note that the present invention is not limited to the description of the following embodiments and examples, and it is apparent to those skilled in the art that modes and details of the present invention can be modified in various ways without departing from the spirit of the present invention disclosed in this specification and the like. Structures of different embodiments can be implemented in an appropriate combination. Note that in the structures of the present invention described below, the same portions or portions having a similar function are denoted by the same reference numerals, and the repeated description thereof is omitted.

Embodiment 1

In this embodiment, a structure and a manufacturing method of a semiconductor device according to one embodiment of the present invention will be described with reference to FIGS. 1A to 1D, FIGS. 2A to 2E, FIGS. 3A to 3E, and FIGS. 4A, 4B-1 to 4B-3, and 4C to 4E.

<Structure>

Figure 1B:
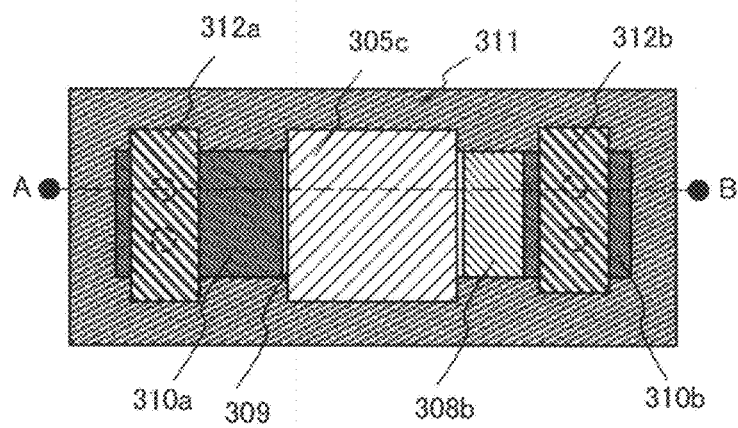

FIGS. 1A and 1B illustrate a transistor which is an example of a component of a semiconductor device. FIG. 1B is a top view of the transistor. FIG. 1A is a cross-sectional view taken along line A-B of FIG. 1B.

The transistor illustrated in FIGS. 1A and 1B includes an insulating film 301 formed over a substrate 300, a semiconductor layer 302 formed over the insulating film 301 and including a second impurity region 310a, a channel formation region 309, a first impurity region 308b, and a second impurity region 310b, a gate insulating film 303a formed so as to cover these components, a first conductive layer 304c formed so as to overlap with the channel formation region 309 with the gate insulating film 303a interposed therebetween, a second conductive layer 305c formed so as to overlap with the channel formation region 309 with the gate insulating film 303a and the first conductive layer 304c interposed therebetween, an interlayer insulating film 311 formed so as to cover the gate insulating film 303a, the first conductive layer 304c, and the second conductive layer 305c, a source electrode 312a electrically connected to the second impurity region 310a, and a drain electrode 312b electrically connected to the second impurity region 310b.

The first conductive layer 304c and the second conductive layer 305c stacked over the first conductive layer 304c function as a gate electrode.

The thickness of a region of the gate insulating film 303a overlapping with the first impurity region 308b is smaller than the thickness of a region of the gate insulating film 303a overlapping with the second impurity region 310a, the second impurity region 310b, and the channel formation region 309.

The second impurity region 310a is a source region, and the first impurity region 308b and the second impurity region 310b are a drain region.

The first impurity region 308b is adjacent to the channel formation region 309, and the second impurity region 310b is adjacent to the first impurity region 308b.

The length of the first impurity region 308b in the channel length direction may be in the range from 10 nm to 3 μm, preferably, from 500 nm to 1.5 μm.

Figure 1C:
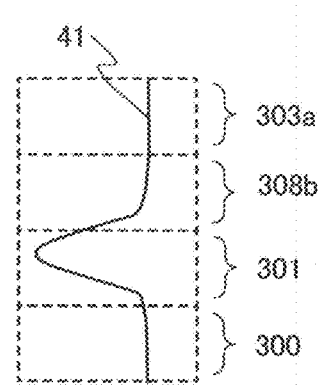
Figure 1D:
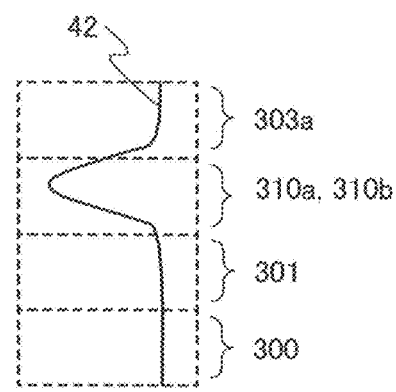

FIG. 1C schematically illustrates, with a curve 41, an impurity concentration distribution in the first impurity region 308b in the depth direction. In addition, FIG. 1D schematically illustrates, with a curve 42, an impurity concentration distribution in the second impurity region 310a and the second impurity region 310b in the depth direction. As illustrated in FIGS. 1C and 1D, a maximum of the impurity concentration distribution in the first impurity region 308b in the depth direction is closer to the insulating film 301 than a maximum of the impurity concentration distribution in the second impurity region 310a and the second impurity region 310b in the depth direction. Thus, in the drain region, the first impurity region 308b having a maximum of the impurity concentration distribution in the depth direction at a deeper position is in contact with the channel formation region 309, and the second impurity region 310b having a maximum of the impurity concentration distribution in the depth direction at a shallower position is in contact with the drain electrode 312b.

Since the maximum of the impurity concentration distribution in the first impurity region 308b in the depth direction is away from an end of the gate electrode, the off-state current of the transistor can be reduced. In addition, the electric field near the drain can be reduced, and deterioration due to hot-carrier injection can be prevented.

Furthermore, since the second impurity region 310b having the maximum of the impurity concentration distribution in the depth direction at a shallower position is in contact with the drain electrode 312b, a favorable electrical connection can be established between the drain region and the drain electrode 312b without an increase in contact resistance.

The maximum of the impurity concentration distribution in the first impurity region 308b in the depth direction may be present in the insulating film 301 as long as it is closer to the insulating film 301 than the maximum of the impurity concentration distribution in the second impurity region 310a and the second impurity region 310b. The maximum of the impurity concentration distribution in the second impurity region 310a and the second impurity region 310b may be present in the gate insulating film 303a.

Note that also in the source region, a first impurity region having a maximum of an impurity concentration distribution in the depth direction closer to the insulating film 301 than a maximum of an impurity concentration distribution in the second impurity region 310a in the depth direction (i.e., away from an end of the gate electrode) may be provided between the second impurity region 310a and the channel formation region 309.

To the first impurity region and the second impurity regions, an impurity element which imparts a first conductivity type (here, p-type) is added. The transistor illustrated in FIGS. 1A and 1B and described here is a p-type transistor, but may be an n-type transistor in which an impurity element imparting a second conductivity type (here, an n-type) is added to the first impurity region and the second impurity regions.

<Manufacturing Process>

Next, a manufacturing process of the transistor illustrated in FIGS. 1A and 1B will be described with reference to FIGS. 2A to 2E, FIGS. 3A to 3E, and FIGS. 4A, 4B-1 to 4B-3, and 4C to 4E.

Figure 2A:
FIGS. 2A to 2E are cross-sectional views illustrating a method for manufacturing a semiconductor device of the present invention.

First, a substrate 400 in which the semiconductor layer 302 is provided over the support substrate 300 with the insulating film 301 interposed therebetween is formed (see FIG. 2A).

An example of a method for manufacturing the substrate 400 will be described below with reference to FIGS. 4A, 4B-1 to 4B-3, and 4C to 4E. Note that the method for manufacturing the substrate 400 is not limited to the manufacturing method described with reference to FIGS. 4A, 4B-1 to 4B-3, and 4C to 4E, and other manufacturing methods may be used.

First, the support substrate 300 (also referred to as a base substrate) is prepared (see FIG. 4A).

As the support substrate 300, an insulating substrate such as a glass substrate, a ceramic substrate, a quartz substrate, or a sapphire substrate is used. Note that an insulating substrate such as a plastic substrate, a semiconductor substrate such as a silicon substrate, a conductive substrate such as a metal substrate or a stainless steel substrate, or the like may be used as the support substrate 300 as appropriate.

As a glass substrate, a substrate having a strain point of 580° C. to 730° C. may be used. Further, it is preferable that the glass substrate be a non-alkali glass substrate. As a material of the non-alkali glass substrate, a glass material such as aluminosilicate glass, aluminoborosilicate glass, or barium borosilicate glass is used, for example. When an inexpensive glass or plastic substrate is used, cost can be reduced.

As the support substrate 300, for example, a single crystal semiconductor substrate including a Group 14 element such as silicon, germanium, silicon germanium, or silicon carbide can be used. Alternatively, a compound semiconductor substrate of gallium arsenide, indium phosphide, or the like can be used.

Although there is no limitation on the size of the support substrate 300 when a semiconductor substrate is used as the support substrate 300, a semiconductor substrate having a diameter of 8 inches (200 mm), 12 inches (300 mm), or 18 inches (450 mm) can be used, for example. Alternatively, a rectangular substrate obtained by processing a circular semiconductor substrate may be used.

Furthermore, as the support substrate 300, besides the single crystal semiconductor substrate or the glass substrate, a substrate which is formed of an insulator, such as a ceramic substrate, a quartz substrate, or a sapphire substrate, a substrate which is formed of a conductor such as metal or stainless steel, or the like can be used. In this embodiment, the case of using a glass substrate as the support substrate 300 is described.

An insulating layer may be formed over a surface of the support substrate 300. By providing the insulating layer, in the case where impurities (such as an alkali metal or an alkaline earth metal) are contained in the support substrate 300, the impurities can be prevented from being diffused into a semiconductor layer which is to be transferred to the support substrate 300 in a later step. As the insulating layer, a silicon oxide layer, a silicon nitride layer, a silicon oxynitride layer, a silicon nitride oxide layer, or the like which is formed by a sputtering method or a CVD method can be used.

Note that silicon oxynitride contains more oxygen than nitrogen and silicon nitride oxide contains more nitrogen than oxygen. Here, the contents thereof are compared on the basis of results of measurement by Rutherford backscattering spectrometry and hydrogen forward scattering spectrometry.

Next, a semiconductor substrate 110 is prepared (see FIG. 4B-1).

As the semiconductor substrate 110, for example, a single crystal semiconductor substrate including a Group 14 element such as silicon, germanium, or silicon germanium can be used. Further, a compound semiconductor substrate of gallium arsenide, indium phosphide, or the like can be used. Note that in this embodiment, the case of using a single crystal silicon substrate as the semiconductor substrate 110 is described.

Next, an insulating film 301 is formed over at least one surface of the semiconductor substrate 110 (see FIG. 4B-2).

The insulating film 301 functions as a bonding layer during bonding to be described later.

The insulating film 301 can be formed using a material such as silicon oxide, silicon oxynitride, silicon nitride, or silicon nitride oxide, for example. These films can be formed using a thin film formation method such as a thermal oxidation method, a CVD method, or a sputtering method. In the case where the insulating film 301 is formed using a CVD method, a silicon oxide layer formed using organosilane such as tetraethylorthosilicate (abbreviation: TEOS, chemical formula: $Si(OC_2H_5)_4$) is preferably used as the insulating film 301 in terms of productivity.

In this embodiment, by subjecting the semiconductor substrate 110 to thermal oxidation treatment, the insulating film 301 (here, a silicon oxide layer) is formed. The thermal oxidation treatment is preferably performed in an oxidizing atmosphere to which a halogen is added. For example, the semiconductor substrate 110 is subjected to thermal oxidation treatment in an oxidizing atmosphere to which chlorine (Cl) is added, whereby the insulating film 301 that is oxidized with HCl is formed. Accordingly, the insulating film 301 includes chlorine atoms.

The chlorine atoms contained in the insulating film 301 cause distortion in the insulating film 301. As a result, the water absorptance of the insulating film 301 is increased, and the water diffusion rate is increased. In other words, when water exists at a surface of the insulating film 301, the water existing at the surface can be quickly absorbed into the insulating film 301 and diffused therein. Accordingly, defective bonding caused by water can be suppressed.

Further, with the chlorine atoms contained in the insulating film 301, heavy metal (such as Fe, Cr, Ni, or Mo) that is an extrinsic impurity can be captured, so that contamination of the semiconductor substrate 110 can be prevented. Moreover, after the bonding to the support substrate 300 which is described later, impurities from the support substrate 300, such as sodium (Na), can be fixed, so that contamination of the semiconductor substrate 110 can be prevented.

Note that the halogen atoms contained in the insulating film 301 are not limited to chlorine atoms. Fluorine atoms may be contained in the insulating film 301. For example, a method by which the surface of the semiconductor substrate 110 is oxidized with fluorine can be used. Examples of oxidation with fluorine include a method in which the semiconductor substrate 110 is soaked in an HF solution and then thermal oxidation treatment is performed in an oxidizing atmosphere, a method in which $NF_3$ is added to an oxidizing atmosphere and thermal oxidation treatment is performed, and the like.

Note that although the insulating film 301 has a single-layer structure in this embodiment, it may have a stacked-layer structure. A structure in which the insulating film 301 is not provided may be employed as long as a problem does not particularly occur in bonding.

Next, the semiconductor substrate 110 is irradiated with ions, whereby an embrittled region 112 is formed (see FIG. 4B-3). Specifically, the semiconductor substrate 110 is irradiated with an ion beam including ions accelerated by an electric field, so that the embrittled region 112 is formed in the semiconductor substrate 110 in a region at a predetermined depth from the surface thereof. The depth at which the embrittled region 112 is formed can be controlled by acceleration energy and incident angle of the ion beam. In other words, the embrittled region 112 is formed in a region at a depth equal to or substantially equal to the average penetration depth of the ions. Here, the depth at which the embrittled region 112 is formed is preferably uniform over the entire area of the semiconductor substrate 110. Note that the surface of the semiconductor substrate 110 is preferably cleaned before ion irradiation.

In addition, the thickness of the semiconductor layer 302 which is formed later is determined by the depth at which the embrittled region 112 is formed. The depth at which the embrittled region 112 is formed is 50 nm to 1 µm, preferably 50 nm to 300 nm, from the surface of the semiconductor substrate 110.

When the semiconductor substrate 110 is irradiated with ions, an ion implantation apparatus or an ion doping apparatus can be used. In an ion implantation apparatus, a source gas is excited to produce ion species, the produced ion species are mass-separated, and a process object is irradiated with an ion species having a predetermined mass. In an ion doping apparatus, a process gas is excited to produce ion species, and a process object is irradiated with the produced ion species without mass separation. Note that in an ion doping apparatus provided with a mass separator, ion irradiation involving mass separation can also be performed as in an ion implantation apparatus.

The step of forming the embrittled region 112 in the case of using an ion doping apparatus can be performed under, for example, the following conditions:

Acceleration voltage is 10 kV to 100 kV (preferably 30 kV to 80 kV).

Dose is $1 \times 10^{16}/cm^2$ to $4 \times 10^{16}/cm^2$.

Beam current density is 2 µA/cm² or more (preferably 5 µA/cm² or more, more preferably 10 µA/cm² or more).

In addition, in the case of using an ion doping apparatus, a gas containing hydrogen can be used as a source gas. With the gas containing hydrogen, $H^+$, $H_2^+$, and $H_3^+$ can be produced as ion species. In the case where the gas containing hydrogen is used as a source gas, it is preferable to perform irradiation with a large amount of $H_3^+$. Specifically, the proportion of $H_3^+$ with respect to the total amount of $H^+$, $H_2^+$, and $H_3^+$ in the ion beam is set to 70% or more. It is more preferable that the proportion of $H_3^+$ ions be 80% or more. By increasing the proportion of $H_3^+$ in this manner, the embrittled region 112 can be made to contain hydrogen at a concentration of $1 \times 10^{20}$ atoms/cm$^3$ or more. Accordingly, separation along the embrittled region 112 can be easily performed. In addition, by irradiation with a large number of $H_3^+$ ions, the embrittled region 112 can be formed in a short time as compared with the case of irradiation with $H^+$ or $H_2^+$. Moreover, with the use of $H_3^+$, the average penetration depth of ions can be made shallower; thus, the embrittled region 112 can be formed in a shallower region.

In the case of using an ion implantation apparatus, it is preferable to perform irradiation with $H_3^+$ ions through mass separation. Of course, irradiation with $H^+$ or $H_2^+$ may be performed. Note that in the case of using an ion implantation apparatus, ion irradiation efficiency may be lower than in the case of using an ion doping apparatus because irradiation is performed with a selected ion species.

As a source gas used for the ion irradiation step, besides a gas containing hydrogen, one or more kinds of gases selected from noble gases such as helium and argon, halogen gases typified by a fluorine gas and a chlorine gas, and halogen compound gases such as a fluorine compound gas (e.g., $BF_3$) can be used. In the case where helium is used as a source gas, an ion beam with a high proportion of He ions can be produced without mass separation. By using such an ion beam, the embrittled region 112 can be formed efficiently.

Further, the embrittled region 112 may be formed by performing ion irradiation plural times. In this case, different source gases may be used for ion irradiation or the same source gas may be used. For example, ion irradiation can be performed using a gas containing hydrogen as a source gas after ion irradiation is performed using a noble gas as a source gas. Alternatively, ion irradiation can be performed using a halogen gas or a halogen compound gas, and then, ion irradiation can be performed using a gas containing hydrogen.

Another method for manufacturing the semiconductor substrate 110 having the embrittled region 112 and the insulating film 301 is that in which a porous region is formed by anodizing one surface of the semiconductor substrate 110, a semiconductor layer is epitaxially grown over the porous region, and then an oxide insulating layer is formed over the semiconductor layer.

Next, the support substrate 300 and the semiconductor substrate 110 are attached to each other (see FIG. 4C). Specifically, the support substrate 300 and the semiconductor substrate 110 are attached to each other with the insulating film 301 interposed therebetween.

Through pressure treatment after the attachment of the support substrate 300 and the semiconductor substrate 110, bonding occurs between the support substrate 300 and the insulating film 301, and automatic bonding extends from that portion to the entire area. Note that as the mechanism of the bonding, a mechanism related to van der Waals' force, a mechanism related to hydrogen bonding, or the like is considered.

By performing surface treatment on at least one of the insulating film 301 formed over the semiconductor substrate 110 and the support substrate 300 before attaching the support substrate 300 and the semiconductor substrate 110, an increase in hydrophilic groups, improvement of planarity, and the like can be achieved, and the bonding strength between the semiconductor substrate 110 and the support substrate 300 can be increased. As a result, defective bonding can be suppressed.

As the surface treatment, a wet etching treatment, a dry etching treatment, or a combination of the both can be employed. Alternatively, a combination of different wet etching treatments or a combination of different dry etching treatments may be employed.

As the wet etching treatment, an ozone treatment using ozone water (ozone water cleaning), megasonic cleaning, two-fluid cleaning (a method in which functional water such as pure water or hydrogenated water and a carrier gas such as nitrogen are sprayed together), or the like can be performed. As the dry etching treatment, an ultraviolet treatment, an ozone treatment, a plasma treatment, a plasma treatment with bias application, a radical treatment, or the like can be performed. The above-described surface treatment of a process object (a semiconductor substrate, an insulating layer formed on a semiconductor substrate, a substrate, or an insulating layer formed over the substrate) has an effect of improving hydrophilicity and cleanliness of the surface of the object. As a result, the bonding strength between the substrates can be improved.

The wet etching treatment is effective for removal of macro dust and the like adhering to a surface of the process object. The dry etching treatment is effective for removal or decomposition of micro dust such as an organic substance which adheres to a surface of the process object. Here, it is preferable that the wet etching treatment such as cleaning be performed after the dry etching treatment such as an ultraviolet treatment, because, in that case, the surface of the process object can be made clean and hydrophilic and generation of watermarks at the surface can be suppressed.

Alternatively, it is preferable to perform a surface treatment using oxygen in an active state such as singlet oxygen. Ozone or oxygen in an active state such as singlet oxygen enables organic substances adhering to the surface of the process object to be removed or decomposed effectively. Further, the treatment using ozone or oxygen in an active state such as singlet oxygen may be combined with treatment using ultraviolet light having a wavelength of lower than 200 nm, so that the organic substances adhering to the surface of the process object can be removed more effectively. This will be specifically described below.

For example, surface treatment can be performed on a surface of a process object by irradiation with ultraviolet light in an atmosphere containing oxygen. By irradiation with ultraviolet light having a wavelength of lower than 200 nm and ultraviolet light having a wavelength of 200 nm or higher in an atmosphere containing oxygen, ozone can be generated and singlet oxygen can be generated. In addition, by irradiation with ultraviolet light having a wavelength of lower than 180 nm, ozone can be generated and singlet oxygen can be generated.

An example of a reaction caused by irradiation with ultraviolet light having a wavelength of lower than 200 nm and ultraviolet light having a wavelength of 200 nm or higher in an atmosphere containing oxygen is shown below.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the reaction formula (1), by irradiation with ultraviolet light (hν) having a wavelength of lower than 200 nm ($\lambda_1$ nm) in an atmosphere containing oxygen ($O_2$), oxygen atoms in a ground state ($O(^3P)$) are generated. Then, in the reaction formula (2), the oxygen atom in a ground state ($O(^3P)$) and oxygen ($O_2$) react with each other to generate ozone ($O_3$).

Next, in the reaction formula (3), irradiation with ultraviolet light having a wavelength of 200 nm or higher ($\lambda_2$ nm) is performed in an atmosphere containing the ozone ($O_3$) generated, whereby singlet oxygen in an excited state ($O(^1D)$) is generated. In an atmosphere containing oxygen, ozone is generated by irradiation with ultraviolet light having a wavelength of lower than 200 nm, and the ozone is decomposed to generate singlet oxygen by irradiation with ultraviolet light having a wavelength of 200 nm or higher. The above-described surface treatment can be performed by, for example, irradiation with a low-pressure mercury lamp ($\lambda_1$=185 nm, $\lambda_2$=254 nm) in an atmosphere containing oxygen.

Further, an example of a reaction caused by irradiation with ultraviolet light having a wavelength of lower than 180 nm in an atmosphere containing oxygen is shown below.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the reaction formula (4), by irradiation with ultraviolet light having a wavelength of lower than 180 nm ($\lambda_3$ nm) in an atmosphere containing oxygen ($O_2$), singlet oxygen in an excited state ($O(^1D)$) and an oxygen atom in a ground state ($O(^3P)$) are generated. Then, in the reaction formula (5), the oxygen atom in a ground state ($O(^3P)$) and oxygen ($O_2$) react with each other to generate ozone ($O_3$). In the reaction formula (6), irradiation with ultraviolet light having a wavelength of lower than 180 nm ($\lambda_3$ nm) is performed in an atmosphere containing the ozone ($O_3$) generated, whereby singlet oxygen in an excited state and oxygen are generated. By irradiation with ultraviolet light having a wavelength of lower than 180 nm in an atmosphere containing oxygen, ozone is generated and the ozone or oxygen is decomposed to generate singlet oxygen. The above-described surface treatment can be performed by, for example, irradiation with a Xe excimer UV lamp in an atmosphere containing oxygen.

Chemical bonds of organic substances or the like adhering to the surface of a process object can be cut by ultraviolet light having a wavelength of lower than 200 nm. Then, organic substances adhering to the surface of the process object, organic substances whose chemical bonds are cut, or the like can be oxidatively decomposed by ozone or singlet oxygen to be removed. The above-described surface treatment can increase the hydrophilicity and cleanliness of the surface of the process object; accordingly, bonding can be favorably performed.

Before bonding the support substrate 300 and the semiconductor substrate 110 to each other, the support substrate 300 and the insulating film 301 may be heated to remove moisture from the surface of the support substrate 300 and the insulating film 301, whereby defective bonding can be suppressed. This is because at the interface between the support substrate 300 and the insulating film 301, incorporation of a gas or particles together with remaining moisture can be suppressed. The heating of the support substrate 300 and the insulating film 301 may be performed at a temperature at which water vaporizes, for example, at 55° C. to 100° C.

After the support substrate 300 and the semiconductor substrate 110 are bonded to each other, the support substrate 300 and semiconductor substrate 110 bonded together may be subjected to heat treatment to strengthen the bonding. The heating temperature at this time needs to be a temperature at which separation along the embrittled region 112 does not proceed. For example, the temperature is set lower than 400° C., preferably lower than or equal to 300° C. The length of the heat treatment is not particularly limited and may be optimally set as appropriate depending on the relationship between processing speed and bonding strength. For example, heat treatment at 200° C. for two hours can be performed. Note that, by irradiating a bonding region with microwaves or the like, only the region can be heated locally. In the case where there is no problem with bonding strength, the heat treatment may be omitted.

Next, the semiconductor substrate 110 is separated into a semiconductor layer 116 and a semiconductor substrate 117 along the embrittled region 112 (see FIG. 4D). The separation of the semiconductor substrate 110 is preferably performed through heat treatment. The temperature of the heat treatment can be set on the basis of the upper temperature limit of the support substrate 300. For example, in the case where a glass substrate is used as the support substrate 300, the heat treatment is preferably performed at a temperature of from 500° C. to 750° C. However, the temperature of the heat treatment is not limited to the above range as long as the glass substrate can withstand the temperature. In this embodiment, the heat treatment is performed at 600° C. for two hours.

Through the above-described heat treatment, the pressure inside microvoids in the embrittled region 112 is increased. Due to the increase in pressure, a change occurs in the volume of the microvoids in the embrittled region 112 to generate cracks in the embrittled region 112. As a result, the semiconductor substrate 110 is separated along the embrittled region 112. Accordingly, the semiconductor layer 302 separated from the semiconductor substrate 110 is left over the support substrate 300. Further, since the bonding interface is heated through this heat treatment, a covalent bond is formed at the interface, so that the bonding can be further strengthened.

Note that the embrittled region 112 may be removed by water jetting in the case where the embrittled region 112 is formed by anodization of the semiconductor substrate 110.

After the separation, the semiconductor substrate 117 becomes a reprocessed semiconductor substrate through a reprocessing process, and can be reused. Since there are defects resulting from the embrittled region 112 or the like at a surface of the semiconductor substrate 117 after the separation, treatment for improving planarity is preferably performed.

After the separation of the semiconductor substrate 110, an end portion of the semiconductor layer 116 may be irradiated with laser light in order to increase the adhesion of the support substrate 300 and the insulating film 301.

Next, the semiconductor layer 116 is subjected to planarization treatment, whereby the semiconductor layer 302 is formed (see FIG. 4E).

As an example of the planarization treatment on the semiconductor layer 116, a laser light irradiation method can be given. By being irradiated with laser light, the semiconductor layer 116 is melted and then cooled and solidified, whereby the semiconductor layer 302 with reduced defects and improved surface planarity can be obtained.

As the laser light, laser light having a wavelength at which the laser light is absorbed by the semiconductor layer 116 can be used.

Further, irradiation with the laser light is performed with energy with which the semiconductor layer 116 is partially or completely melted. Note that it is preferable that the semiconductor layer 116 be partially melted by irradiation with the laser light. In this case, the term "partial melting" means that the upper part of the semiconductor layer 116 is melted and is in a liquid phase while the lower part thereof is not melted and is still in a solid phase. By partial melting of the semiconductor layer, crystal growth proceeds from a nonmelted solid phase part. Accordingly, the semiconductor layer 302 with high surface planarity and few defects can be formed. Moreover, by partial melting of the semiconductor layer 116, an increase in the temperature of the support substrate 300 can be suppressed. Therefore, a substrate with low heat resistance such as a glass substrate can be used as the support substrate 300. Note that a polycrystalline semiconductor region that is formed by irradiation with the laser light may be selectively removed.

In addition, the semiconductor layer 302 can be obtained by performing a thinning step for decreasing the thickness of the semiconductor layer 116 through etching treatment, polishing treatment such as chemical mechanical polishing (CMP), or the like.

As the etching treatment, for example, one of a dry etching treatment and a wet etching treatment or a combination of both of the etching processes may be performed. When the semiconductor layer 116 is formed using silicon, the semiconductor layer 116 can be thinned by dry etching treatment using $SF_6$ and $O_2$ as process gases.

Further, a polishing treatment such as CMP may be performed instead of an etching treatment; alternatively, a combination of an etching treatment and a CMP treatment may be performed. The semiconductor layer 116 can have a thickness of, for example, 10 nm to 200 nm.

In the above manner, the substrate 400 in which the semiconductor layer 302 is provided over the support substrate 300 with the insulating film 301 interposed therebetween can be formed.

Figure 2B:
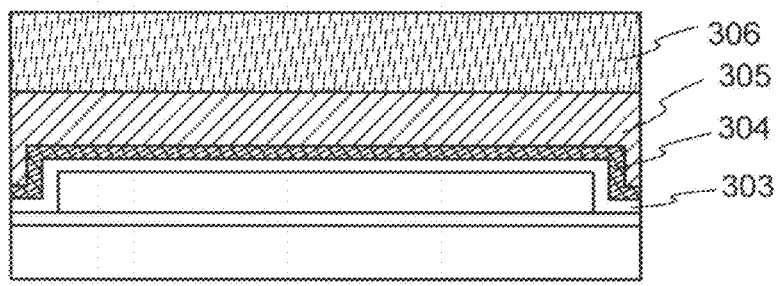

Next, a gate insulating film 303, a first conductive film 304, a second conductive film 305, and a resist film 306 are formed over the semiconductor layer 302 so as to cover the substrate 300 (see FIG. 2B). In this embodiment, the first conductive film 304 and the second conductive film 305 are stacked so that a gate electrode having a stacked-layer structure is formed over the gate insulating film 303.

As the gate insulating film 303, a single layer of silicon oxide is formed using a plasma CVD method. Other than silicon oxide, the gate insulating film 303 can be formed so as to have a single-layer structure or a stacked-layer structure of layers including silicon oxynitride, silicon nitride oxide, silicon nitride, hafnium oxide, aluminum oxide, tantalum oxide, or the like.

As a manufacturing method other than a plasma CVD method, a sputtering method or a method using oxidation or nitridation through high density plasma treatment can be given. High-density plasma treatment is performed using, for example, a mixed gas of a noble gas such as helium, argon, krypton, or xenon and a gas such as oxygen, nitrogen oxide, ammonia, nitrogen, or hydrogen. In this case, if plasma excitation is performed by introduction of microwaves, plasma with low electron temperature and high density can be generated. The surface of the semiconductor layer is oxidized or nitrided with oxygen radicals (OH radicals may be included) or nitrogen radicals (NH radicals may be included) which are generated by such high-density plasma, whereby an insulating layer with a thickness of 1 nm to 20 nm, preferably, 2 nm to 10 nm, is formed in contact with the semiconductor layer.

Since the oxidation or nitridation of the semiconductor layer by the above-described high-density plasma treatment is a solid-phase reaction, the interface state density between the gate insulating film 303 and the semiconductor layer 302 can be drastically reduced. Further, when the semiconductor layer 302 is directly oxidized or nitrided by the high-density plasma treatment, variation in the thickness of the gate insulating film 303 to be formed can be suppressed. Note that the gate insulating film 303 formed by high-density plasma treatment can have less variation in characteristics.

The gate insulating film 303 may also be formed by thermal oxidation of a surface of the semiconductor layer 302. In the case of thermal oxidation, it is necessary to use a substrate having a certain degree of heat resistance.

Note that after the gate insulating film 303 containing hydrogen is formed, hydrogen contained in the gate insulating film 303 may be diffused into the semiconductor layer 302 by performing heat treatment at a temperature of 350° C. to 450° C. In this case, the gate insulating film 303 can be formed with silicon nitride or silicon nitride oxide using a plasma CVD method. Note that the process temperature is preferably set to 350° C. or lower. With such a supply of hydrogen to the semiconductor layer 302, defects in the semiconductor layer 302 and at the interface between the gate insulating film 303 and the semiconductor layer 302 can be effectively reduced.

The first conductive film 304 and the second conductive film 305 to be a gate electrode are stacked. As the first conductive film 304, a molybdenum film, a titanium film, a titanium nitride film, or the like may be used, and as the second conducive film 305, an aluminum film, a tungsten film, or the like may be used, for example. In this embodiment, a conductive film having a two-layer structure in which a titanium nitride film is used as the first conductive film 304 and a tungsten film is used as the second conductive film 305 is formed.

Figure 2C:
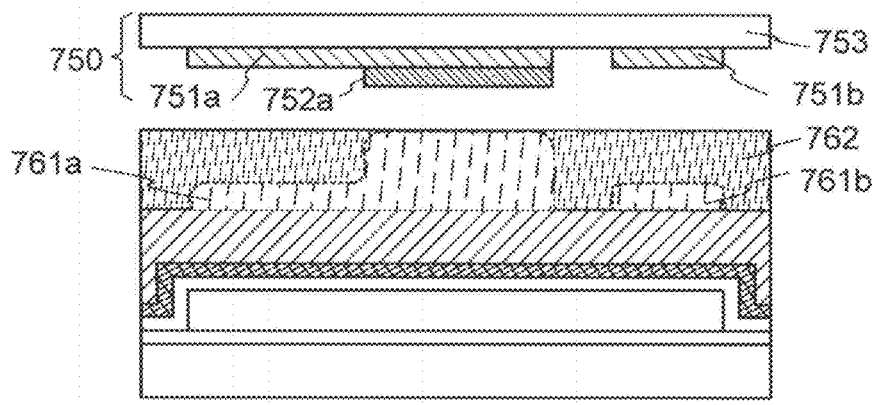
Figure 2D:
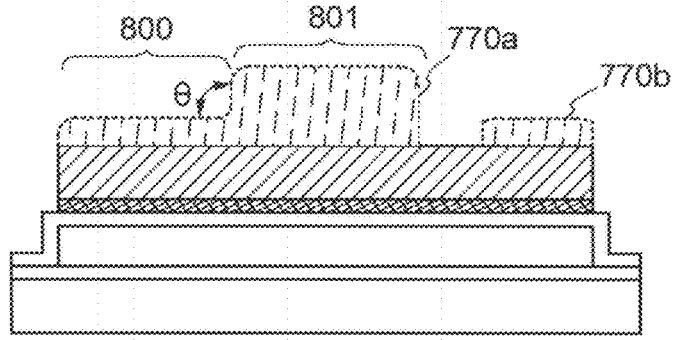

Next, a mask layer 770a and a mask layer 770b are formed using a light exposure mask 750 having a light-intensity reducing function (see FIGS. 2C and 2D).

The light exposure mask having a light-intensity reducing function is a light exposure mask provided with an auxiliary pattern which is formed of a semi-transmitting film and has a light-intensity reducing function.

In addition, the light exposure mask having a light-intensity reducing function can reduce the intensity of light passing therethrough to 10% to 70% owing to the light-intensity reducing function of the semi-transmitting film. In this embodiment, a positive type resist in which a region exposed to light is removed is used.

The light exposure mask 750 is located above the resist film 306 with an optical system interposed therebetween.

In the light exposure mask 750, a light-transmitting substrate 753 is provided with a semi-transmitting film 751a and a semi-transmitting film 751b formed of MoSiN, and is provided with a light-blocking portion 752a formed of a metal film of Cr or the like so as to be stacked on the semi-transmitting film 751a. The semi-transmitting film 751a and the semi-transmitting film 751b can be formed using MoSi, MoSiO, MoSiON, CrSi, or the like as well as MoSiN.

Through light exposure of the resist film 306 using the light exposure mask 750, a light exposed region 762, a non-light-exposed region 761a, and a non-light-exposed region 761b are formed in the resist film 306. The light exposed region 762 is formed with light travelling around the light-blocking portion or passing through the semi-transmitting films during light exposure.

Then, through development, the light exposed region 762 is removed, whereby the mask layer 770a and the mask layer 770b which are resist patterns illustrated in FIG. 2D are obtained.

As another method for forming the mask layer 770a and the mask layer 770b, there is a method in which a light exposure mask capable of transmitting light with a plurality of intensities is used.

The light exposure mask capable of transmitting light with a plurality of intensities is that in which a diffraction grating pattern with a plurality of slits is provided between light-blocking portions. The diffraction grating pattern is a pattern provided with at least one opening pattern such as a slit or a dot. When a plurality of openings is provided, the openings may be arranged regularly (periodically) in some order or randomly (non-periodically). By using a diffraction grating pattern having an opening (space) and a non-opening (line) with a fine width smaller than or equal to the resolution of a light exposure apparatus, a substantial amount of light exposure can be changed and the thickness of a light exposed resist film after development can be controlled. The resolution is the smallest possible width obtained with the light exposure apparatus. In a projection light exposure apparatus, a resolution R is expressed as R=Kλ/NA. K is a constant, λ is a wavelength of light used for light exposure, and NA is the number of openings in the projection lens. Therefore, when the resist film is processed using the method illustrated in FIG. 2C, the resist film can be selectively processed finely without increasing the number of steps, whereby a variety of resist patterns (mask layers) can be obtained.

A diffraction grating having a light-intensity reducing function for the light exposure mask 750 preferably has an opening with a/b×0.8 or less and a non-opening with a/b×0.5 or less where a is the resolution and b is the reduction ratio of a light exposure apparatus. Specifically, when a=1.5 μm and b=1, the opening/non-opening is 0.5 μm/0.5 μm, 0.75 μm/0.75 μm, 1 μm/0.5 μm, or 0.75 μm/0.5 μm.

Through the above-described light exposure step, the mask layer 770a and the mask layer 770b are formed such that the thickness of a region 800 of the mask layer 770a and the thickness of the mask layer 770b are smaller than the thickness of a region 801 of the mask layer 770a. This is in order to remove part of the mask layer 770a and the mask layer 770b through treatment such as ashing described below. For example, the percentage of the thickness of the region 800 and the mask layer 770b to the thickness of the region 801 may be more than or equal to 5% and less than or equal to 90%, preferably, more than or equal to 7% and less than or equal to 50%, more preferably, more than or equal to 10% and less than 35%.

In addition, in order to remove the region 800 of the mask layer 770a and leave part of the region 801 of the mask layer 770a, it is preferable that the angle θ between the region 800 of the mask layer 770a and the region 801 of the mask layer 770a be equal to or substantially equal to a right angle. When the angle θ between the region 800 of the mask layer 770a and the region 801 of the mask layer 770a is equal to or substantially equal to a right angle, a mask layer 780a can be formed so as to be the same or substantially the same length in the channel length direction as a second conductive layer 305c which is formed later.

In this embodiment, the thickness of the region 800 of the mask layer 770a and the thickness of the mask layer 770b are approximately 400 nm, and the thickness of the region 801 of the mask layer 770a is approximately 1.4 μm. Note that depending on light exposure conditions, the mask layer 770a and the mask layer 770b obtained using the light exposure mask 750 may have finely uneven surfaces, within the region 800 and the region 801. Therefore, the thicknesses are considered to be average thicknesses. The thicknesses given below are also considered to be average thicknesses.

Figure 2E:
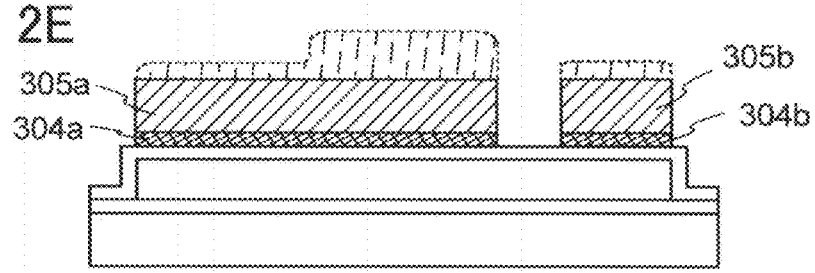

Next, the first conductive film 304 and the second conductive film 305 are etched using the mask layer 770a and the mask layer 770b, whereby a first conductive layer 304a, a second conductive layer 305a, a first conductive layer 304b, and a second conductive layer 305b are formed (see FIG. 2E).

As the etching treatment for forming the first conductive layer 304a, the second conductive layer 305a, the first conductive layer 304b, and the second conductive layer 305b from the first conductive film 304 and the second conductive film 305, for example, dry etching can be employed, but one embodiment of the disclosed invention is not limited thereto. In this embodiment, dry etching is used as the etching treatment. Through the etching treatment, the mask layer 770a and the mask layer 770b may be reduced in thickness. For example, when dry etching is performed, the mask layer 770a and the mask layer 770b have a thickness reduction of approximately 100 nm to 200 nm.

Then, part of the mask layer 770a and the mask layer 770b are removed by performing treatment such as ashing on the mask layer 770a and the mask layer 770b, whereby a mask layer 780a is formed (see FIG. 3A).

The treatment such as ashing is performed here in order to remove the mask layer 770b. This is because it is necessary to remove the second conductive layer 305b in order to expose the first conducive layer 304b at the surface and it is necessary to remove the mask layer 770b in order to remove the second conductive layer 305b.

The mask layer 770a and the mask layer 770b are made to recede (reduced) by performing treatment such as ashing. Because the thickness of the region 800 of the mask layer 770a and the mask layer 770b is smaller than the thickness of the region 801 of the mask layer 770a, the region 800 of the mask layer 770a and the mask layer 770b are removed before the region 801 of the mask layer 770a. Note that the region 801 of the mask layer 770a is also subjected to treatment such as ashing and therefore recedes (is reduced) and is processed into the mask layer 780a. By removal of part of the mask layer 770a and the mask layer 770b, part of a surface of the second conductive layer 305a (a region 802 in FIG. 3A) and a surface of the second conductive layer 305a are exposed.

Conditions for the treatment such as ashing may be selected as appropriate so that part of the mask layer 770a (the mask layer 780a) remains and the mask layer 770b is removed. In this embodiment, as ashing treatment, ashing treatment with oxygen plasma is employed. In the case where ashing treatment with oxygen plasma is performed, the thickness of the region 801 of the mask layer 770a is decreased (reduced) by approximately 600 nm, and the length of the region 801 of the mask layer 770a in the channel length direction is decreased (reduced) by approximately 800 nm.

Next, by selective etching treatment using the mask layer 780a, the second conductive layer 305c can be formed from the second conductive layer 305a. On the other hand, the second conductive layer 305b is removed by the etching treatment, and a surface of the first conductive layer 304b is exposed. In addition, by the selective etching treatment, part of the gate insulating film 303 other than a region thereof overlapping with the first conductive layer 304a and the first conductive layer 304b is etched and becomes thinner (or have a thickness reduction), whereby the gate insulating film 303a is formed. Note that a side end of the first conductive layer 304a extends beyond a side end of the second conductive layer 305c (see FIG. 3B).

Next, as an impurity element imparting one conductivity type, an impurity element 307 imparting p-type conductivity is introduced into the semiconductor layer 302 over which the mask layer 780a, the first conductive layer 304a, the second conductive layer 305c, and the first conductive layer 304b are provided, whereby the first impurity region 308b, the second impurity region 310a, and the second impurity region 310b are formed (see FIG. 3C). In addition, a region of the semiconductor layer 302 to which the impurity element 307 is not added serves as the channel formation region 309. Here, as the impurity element imparting one conductivity type, boron is used. Other than boron, aluminum or the like can be used, for example.

The conditions for the addition of the impurity element 307 can be changed as appropriate depending on required characteristics or the like.

Although a p-type transistor is formed in this embodiment using an impurity element imparting p-type conductivity, an n-type transistor may be formed using an impurity element imparting n-type conductivity. As the impurity element imparting n-type conductivity, phosphorus, arsenic, or the like can be used, for example, As a method for introducing the impurity element 307 imparting one conductivity type to the semiconductor layer 302, an ion doping method, an ion implantation method, or the like can be used.

A maximum of the impurity concentration distribution in the depth direction in the first impurity region 308b formed by adding the impurity element 307 is closer to the insulating film 301 than a maximum of the impurity concentration distribution in the depth direction in the second impurity region 310a and the second impurity region 310b. This is because during the addition of the impurity element 307 to the semiconductor layer 302, the first conductive layer 304b functions as a mask and prevents the introduction of the impurity element 307.

In addition, the impurity element 307 is not introduced to the channel formation region because the first conductive layer 304a and the second conductive layer 305a function as a mask.

In this embodiment, with the use of the first conductive layer 304a, the second conductive layer 305c, and the first conductive layer 304b as a mask, the first impurity region 308b, the second impurity region 310a, the second impurity region 310b, and the channel formation region 309 are formed in a self-aligned manner by a single addition of the impurity element 307. By a single addition of the impurity element 307, regions having different maximums of impurity concentration distribution can be formed. Accordingly, a reduction in the number of masks and a simplification of the manufacturing process can be achieved.

Next, the mask layer 780a formed over the second conductive layer 305c is removed.

In this embodiment, the mask layer 780a is removed after the impurity element 307 is added, but may be removed before the impurity element 307 is added.

Next, by using the second conductive layer 305c as a mask, the first conductive layer 304a and the first conductive layer 304b are selectively etched, whereby the first conductive layer 304c is formed (see FIG. 3D).

Note that before the first conductive layer 304a and the first conductive layer 304b are selectively etched, the side end of the first conductive layer 304a on the first conductive layer 304b side extends beyond the side end of the second conductive layer 305c on the first conductive layer 304b side. Therefore, when the first conductive layer 304a and the first conductive layer 304b are selectively etched, the region of the first conductive layer 304a which extends beyond the side end of the second conductive layer 305c is also removed, whereby the first conductive layer 304c is formed.

Thus, it is possible that a region where the channel formation region 309 is not covered with the gate electrode (an off-set region) is formed as illustrated in FIG. 3D. However, the length of the off-set region in the channel length direction is very small; thus, it can be considered that no off-set region is formed owing to indirect addition of the impurity element 307.

The first conductive layer 304c and the second conductive layer 305c function as a gate electrode.

Next, the interlayer insulating film 311 is formed so as to cover the gate insulating film 303a, the first conductive layer 304c, and the second conductive layer 305c, and contact holes are formed in the interlayer insulating film 311 so as to expose part of the second impurity region 310a and part of the second impurity region 310b.

As the interlayer insulating film 311, an insulating layer formed of an inorganic material such as silicon oxide or borophosphosilicate glass (BPSG) or a layer formed of an organic resin such as polyimide or acrylic or the like can be used. The interlayer insulating film 311 can have a single-layer structure or a stacked-layer structure.

Next, a conductive layer is formed so as to be in contact with the second impurity region 310a and the second impurity region 310b through the contact holes and is then selectively etched, whereby the source electrode 312a and the drain electrode 312b are formed (see FIG. 3E).

As the conductive layer, a conductive layer having a three-layer structure in which a low-resistance metal layer of aluminum, an aluminum alloy, or the like is sandwiched between barrier metal layers can be formed, for example. For the barrier metal layers, molybdenum, chromium, titanium, or the like can be used.

Through the above process, the transistor including the first impurity region 308b, the second impurity region 310a, and the second impurity region 310b can be manufactured.

Note that as the semiconductor layer 302, a single crystal semiconductor layer including a Group 14 element such as silicon, germanium, or silicon germanium can be used, for example. In the case where a single crystal semiconductor layer is used as the semiconductor layer 302, an impurity element for controlling the resistance, such as a donor element or an acceptor element, may be added. Further, a compound semiconductor layer including gallium arsenide, indium phosphide, or the like can be used. Other than a single crystal semiconductor layer, a polycrystalline semiconductor layer, an amorphous semiconductor layer, or the like can be used. Note that in this embodiment, a single crystal silicon layer is used as the semiconductor layer 302.

In this embodiment, the first impurity region and the second impurity regions can be formed at the same time by a single addition; thus, a reduction in the number of masks and a simplification of the manufacturing process can be achieved. Accordingly, an increase in productivity can be achieved.

In this embodiment, in the drain region, the first impurity region 308b having a maximum of the impurity concentration distribution in the depth direction at a deeper position is in contact with the channel formation region 309, and the second impurity region 310b having a maximum of the impurity concentration distribution in the depth direction at a shallower position is in contact with the drain electrode 312b.

Since the maximum of the impurity concentration distribution in the first impurity region 308b in the depth direction is away from an end of the gate electrode, the off-state current of the transistor can be reduced. In addition, the electric field near the drain can be reduced, and deterioration due to hot-carrier injection can be prevented.

Furthermore, since the second impurity region 310b having the maximum of the impurity concentration distribution in the depth direction at a shallower position is in contact with the drain electrode 312b, a favorable electrical connection can be established between the drain region and the drain electrode 312b without an increase in contact resistance.

As described above, a transistor with reduced off-state current can be manufactured. Thus, by using the transistor, a highly reliable semiconductor device can be provided.

Note that this embodiment can be implemented in an appropriate combination with any of the configurations described in the other embodiments.

Embodiment 2

A method for manufacturing a display device of this embodiment will be described in detail with reference to FIGS. 5A to 5C, FIGS. 6A and 6B, FIGS. 7A to 7D, FIGS. 8A and 8B, FIGS. 9A to 9C, FIGS. 10A and 10B, FIGS. 11A and 11B, and FIGS. 12A and 12B.

Figure 5A:
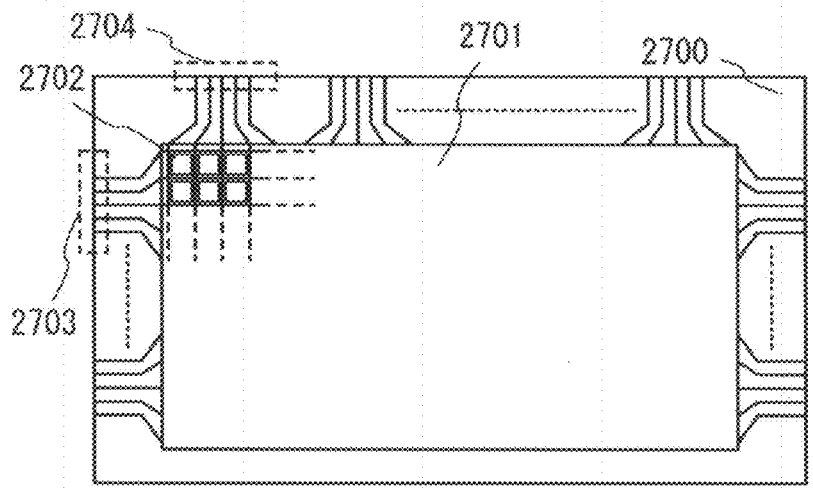
FIGS. 5A to 5C are each a top view of a display device of the present invention.

FIG. 5A is a top view illustrating a configuration of a display panel according to the present invention, where a pixel portion 2701 in which pixels 2702 are arranged in matrix, a scan line side input terminal 2703, and a signal line side input terminal 2704 are formed over a substrate 2700 having an insulating surface. The number of pixels may be determined in accordance with various standards. In the case of XGA, the number of pixels may be 1024×768×3 (RGB). In the case of UXGA, the number of pixels may be 1600×1200×3 (RGB), and in the case of a full-spec high-definition display, the number of pixels may be 1920×1080×3 (RGB).

The pixels 2702 are arranged in matrix at intersections of scan lines extending from the scan line side input terminal 2703 and signal lines extending from the signal line side input terminal 2704. Each of the pixels 2702 is provided with a switching element and a pixel electrode layer connected to the switching element. A typical example of the switching element is a TFT. A conductive layer side of the TFT is connected to a scan line, and a source or drain side of the TFT is connected to a signal line, which enables each pixel to be independently controlled by signals that are input from an external portion.

Figure 6A:
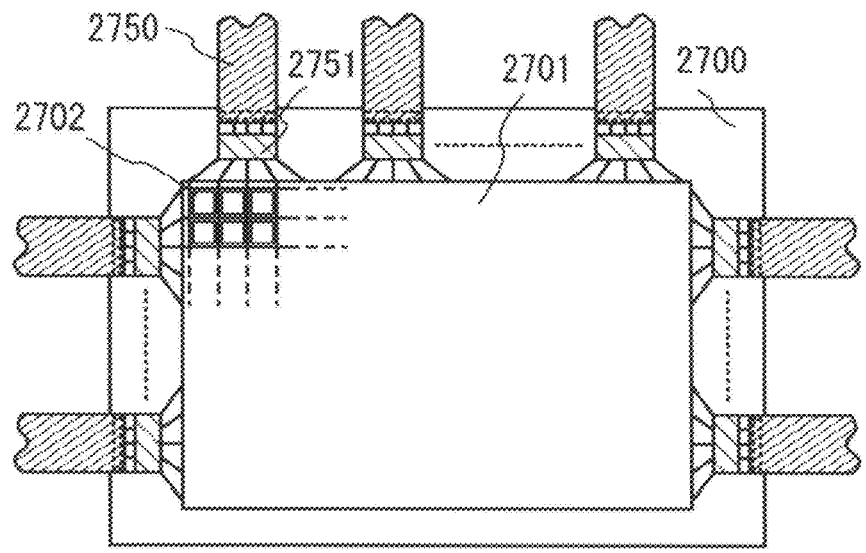
FIGS. 6A and 6B are each a top view of a display device of the present invention.
Figure 6B:
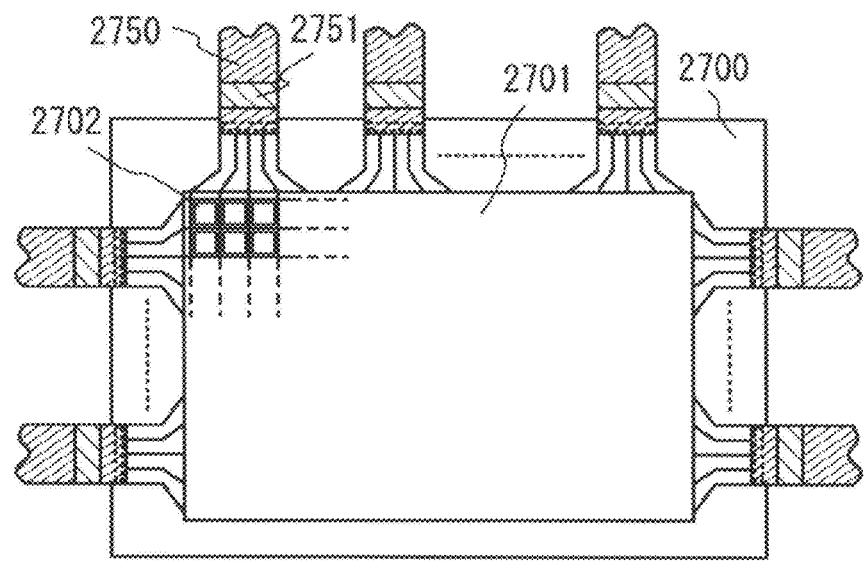

FIG. 5A illustrates a configuration of a display panel in which signals to be input to the scan lines and the signal lines are controlled by an external driver circuit. Alternatively, a driver IC 2751 may be mounted on the substrate 2700 by a chip-on-glass (COG) method as illustrated in FIG. 6A. As another mounting mode, a tape-automated bonding (TAB) method may also be used as illustrated in FIG. 6B. The driver IC may be formed on a single crystal semiconductor substrate or may be formed with a TFT over a glass substrate. In each of FIGS. 6A and 6B, the driver IC 2751 is connected to a flexible printed circuit (FPC) 2750.

Figure 5B:
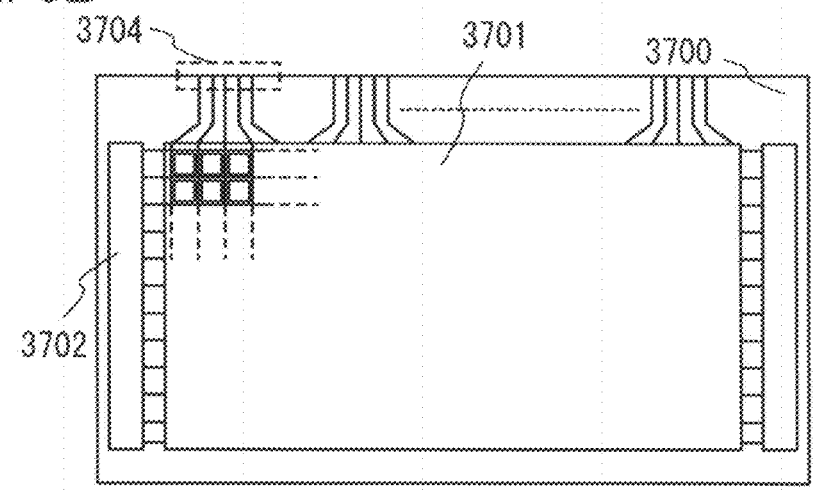
Figure 5C:
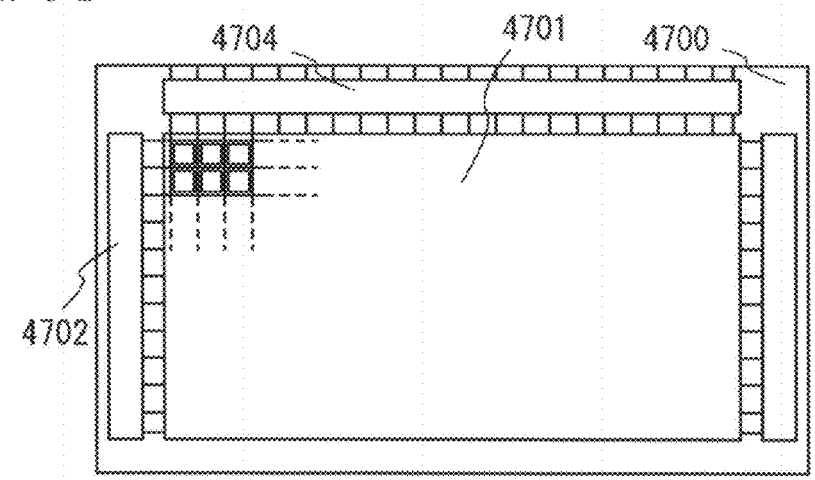

When a TFT provided in a pixel is formed with a crystalline semiconductor, a scan line side driver circuit 3702 can be formed over a substrate 3700 as illustrated in FIG. 5B. In FIG. 5B, a pixel portion 3701 is controlled by an external driver circuit connected to a signal line side input terminal 3704 as in FIG. 5A. When a TFT in a pixel is formed from a polycrystalline (microcrystalline) semiconductor, a single crystal semiconductor, or the like having high mobility, a pixel portion 4701, a scan line side driver circuit 4702, and a signal line side driver circuit 4704 can all be formed over a substrate 4700 as illustrated in FIG. 5C.

Next, a method for manufacturing transistors used for the display devices illustrated in FIGS. 5B and 5C will be described with reference to FIGS. 7A to 7D, FIGS. 8A and 8B, FIGS. 9A to 9C, FIGS. 10A and 10B, FIGS. 11A and 11B, and FIGS. 12A and 12B.

First, a substrate 400 in which a semiconductor layer 103, a semiconductor layer 104, a semiconductor layer 105, and a semiconductor layer 106 are provided over a support substrate 300 with an insulating film 301 interposed therebetween is formed (see FIG. 7A). The substrate 400 can be manufactured using a method similar to that in Embodiment 1; therefore, detailed description is omitted here.

Next, a gate insulating layer 107 is formed so as to cover the semiconductor layer 103, the semiconductor layer 104, the semiconductor layer 105, and the semiconductor layer 106, and a first conductive film 108 and a second conductive film 109 are stacked over the gate insulating layer 107 (see FIG. 7B).

The gate insulating layer 107, the first conductive film 108, and the second conductive film 109 can be formed in a manner similar to that of the gate insulating film 303, the first conductive film 304, and the second conductive film 305 of Embodiment 1; therefore, detailed description is omitted here.

Over the gate insulating layer 107, the first conductive film 108, and the second conductive film 109, a mask layer 157a, a mask layer 158a, a mask layer 157b, a mask layer 158b, a mask layer 157c, a mask layer 158d, a mask layer 157e, and a mask layer 158e are formed using a resist for processing into a desired shape (see FIG. 7C). The mask layer 157a, the mask layer 158a, the mask layer 157b, the mask layer 158b, the mask layer 157c, the mask layer 158d, the mask layer 157e, and the mask layer 158e can be formed using a light exposure mask having a light-intensity reducing function or a light exposure mask capable of transmitting light with a plurality of intensities, in a manner similar to that of the mask layer 770a and the mask layer 770b described in Embodiment 1. With such a light exposure mask, various light exposures can be more accurately controlled, which enables a resist to be processed into a more accurate shape. Therefore, by using such mask layers, a conductive film and an insulating film can be processed into different shapes in accordance with a desired performance in the same step. Therefore, transistors with different characteristics, wirings of different sizes or shapes, or the like can be manufactured without increasing the number of steps.

Next, by using the mask layer 157a, the mask layer 158a, the mask layer 157b, the mask layer 158b, the mask layer 157c, the mask layer 158d, the mask layer 157e, and the mask layer 158e, the first conductive film 108 and the second conductive film 109 are etched into desired shapes. Accordingly, a first conducive layer 121, a first conducive layer 122, a first conductive layer 124, a first conductive layer 125, a first conductive layer 126, a first conductive layer 141, a first conductive layer 142, a first conductive layer 145, and a first conductive layer 146, and a second conductive layer 131, a second conductive layer 132, a second conductive layer 134, a second conductive layer 135, and a second conductive layer 136 are formed (see FIG. 7D).

In the step of etching the first conductive film 108 and the second conductive film 109, the mask layer 157a, the mask layer 157b, the mask layer 157c, and the mask layer 157e are etched into a mask layer 110a, a mask layer 110b, a mask layer 110c, a mask layer 110d, and a mask layer 110e. On the other hand, the mask layer 158a, the mask layer 158b, the mask layer 158d, and the mask layer 158e are etched, whereby the first conductive layer 141, the first conductive layer 142, the first conductive layer 145, and the first conductive layer 146 are exposed.

After the etching step, the mask layer 110a, the mask layer 110b, the mask layer 110c, the mask layer 110d, and the mask layer 110e are removed.

A method for etching the first conductive film 108 and the second conductive film 109 into desired shapes by using the mask layer 157a, the mask layer 158a, the mask layer 157b, the mask layer 158b, the mask layer 157c, the mask layer 158d, the mask layer 157e, and the mask layer 158e can be similar to that in Embodiment 1; therefore, detailed description is omitted here.

The first conductive layers and the second conductive layers have perpendicular side surfaces. However, the present invention is not limited thereto, and the first and second conductive layers may have a tapered shape.

In the etching step for formation of the conductive layers, the gate insulating layer 107 may be etched to some degree and the thickness thereof may be reduced (a so-called thickness reduction).

Next, a mask layer 153a is formed so as to cover the first conductive layer 121, the second conductive layer 131, and the semiconductor layer 103, and a mask layer 153b is formed so as to cover the first conductive layer 126, the second conductive layer 136, and the semiconductor layer 106. Then, an impurity element 152 imparting one conductivity type is introduced to the semiconductor layer 104 and the semiconductor layer 105, whereby impurity regions are formed (see FIG. 8A). In the step of FIG. 8A, an impurity element imparting n-type conductivity (in this embodiment, phosphorus (P)) is used as the impurity element 152 imparting one conductivity type in order to form n-type transistors.

As a method for introducing the impurity element 152 imparting one conductivity type, an ion doping method, an ion implantation method, or the like can be used.

The conditions for the addition of the impurity element 152 can be changed as appropriate depending on required characteristics or the like.

The impurity element 152 imparting n-type conductivity is added to the semiconductor layer 104 over which the first conductive layer 122, the first conductive layer 142, and the second conductive layer 132 are provided and the semiconductor layer 105 over which the first conductive layer 124, the first conductive layer 125, the first conductive layer 145, the second conductive layer 134, and the second conductive layer 135 are provided. Accordingly, a first impurity region 145b, a first impurity region 148b, a first impurity region 148d, a second impurity region 144a, a second impurity region 144b, a second impurity region 147a, a second impurity region 147b, and a second impurity region 147c are formed. In addition, a region of the semiconductor layer 104 and regions of the semiconductor layer 105 to which the impurity element 152 is not added serve as a channel formation region 150, a channel formation region 149a, and a channel formation region 149b. Note that the semiconductor layer 103 and the semiconductor layer 106 are masked by the mask layer 153a and the mask layer 153b; therefore, impurity regions are not formed therein even when the impurity element 152 is added.

A maximum of the impurity concentration distribution in the depth direction in each of the first impurity region 145b, the first impurity region 148b, and the first impurity region 148d formed by adding the impurity element 152 is closer to the insulating film 301 than a maximum of the impurity concentration distribution in the depth direction in each of the second impurity region 144a, the second impurity region 144b, the second impurity region 147a, the second impurity region 147b, and the second impurity region 147c. This is because when the impurity element 152 is added to the semiconductor layer 104 and the semiconductor layer 105, the first conductive layer 121, the first conductive layer 122, the first conductive layer 124, the first conductive layer 125, the first conductive layer 126, the first conductive layer 141, the first conductive layer 142, the first conductive layer 145, and the first conductive layer 146 function as a mask and prevent the introduction of the impurity element 152.

In this embodiment, the first impurity regions having n-type conductivity and the second impurity regions having n-type conductivity can be formed in a self-aligned manner by a single addition of the impurity element 152 imparting n-type conductivity. Accordingly, a reduction in the number of light exposure masks and a simplification of the manufacturing process can be achieved.

Next, the mask layer 153a and the mask layer 153b are removed, and a mask layer 155a is formed so as to cover the first conductive layer 122, the second conductive layer 132, the first conductive layer 142, and the semiconductor layer 104, and a mask layer 155b is formed so as to cover the first conductive layer 124, the second conductive layer 134, the first conductive layer 125, the second conductive layer 135, the first conductive layer 145, and the semiconductor layer 105. Then, an impurity element 154 imparting one conductivity type is added (introduced) to the semiconductor layer 103 and the semiconductor layer 106, whereby impurity regions are formed (see FIG. 8B). In the step of FIG. 8B, an impurity element imparting p-type conductivity (in this embodiment, boron (B)) is used as the impurity element 154 imparting one conductivity type in order to form p-type transistors.

For a method for introducing the impurity element 154 imparting one conductivity type, Embodiment 1 can be referred to; therefore, detailed description is omitted here.

The impurity element 154 imparting p-type conductivity is added to the semiconductor layer 103 over which the first conductive layer 121, the first conductive layer 141, and the second conductive layer 131 are provided and the semiconductor layer 106 over which the first conductive layer 126, the first conductive layer 146, and the second conductive layer 136 are provided. Accordingly, a first impurity region 161b, a first impurity region 164b, a second impurity region 160a, a second impurity region 160b, a second impurity region 163a, and a second impurity region 163b are formed. In addition, a region of the semiconductor layer 103 and a region of the semiconductor layer 106 to which the impurity element 154 is not added serve as a channel formation region 162 and a channel formation region 165. Note that the semiconductor layer 104 and the semiconductor layer 105 are masked by the mask layer 155a and the mask layer 155b; therefore, impurity regions are not formed therein even when the impurity element 154 is added.

A maximum of the impurity concentration distribution in the depth direction in each of the first impurity region 161b and the first impurity region 164b formed by adding the impurity element 154 is closer to the insulating film 301 than a maximum of the impurity concentration distribution in the depth direction in each of the second impurity region 160a, the second impurity region 160b, the second impurity region 163a, and the second impurity region 163b. This is because when the impurity element 154 is added to the semiconductor layer 103 and the semiconductor layer 106, the first conductive layer 121, the first conductive layer 126, the first conductive layer 141, and the first conductive layer 146 function as a mask and prevent the introduction of the impurity element 154.

In this embodiment, the first impurity regions having p-type conductivity and the second impurity regions having p-type conductivity can be formed in a self-aligned manner by a single addition of the impurity element 154 imparting p-type conductivity. Accordingly, a reduction in the number of light exposure masks and a simplification of the manufacturing process can be achieved.

After the impurity element 154 imparting p-type conductivity is added, the mask layer 155a and the mask layer 155b are removed.

Next, by using the second conductive layer 131, the second conductive layer 132, the second conductive layer 134, the second conductive layer 135, and the second conductive layer 136 as a mask, the first conductive layer 141, the first conductive layer 142, the first conductive layer 145, and the first conductive layer 146 are removed, and a first conductive layer 121c, a first conductive layer 122c, a first conductive layer 124c, a first conductive layer 125c, and a first conductive layer 126c are formed from the first conductive layer 121, the first conductive layer 122, the first conductive layer 124, the first conductive layer 125, and the first conductive layer 126 (see FIG. 9A).

For a method for removing the first conductive layer 141, the first conductive layer 142, the first conductive layer 145, and the first conductive layer 146, Embodiment 1 can be referred to; therefore, detailed description is omitted here.

Before the first conductive layer 141, the first conductive layer 142, the first conductive layer 145, and the first conductive layer 146 are removed, the first conductive layer 121, the first conductive layer 122, the first conductive layer 124, the first conductive layer 125, and the first conductive layer 126 extend beyond side ends of the second conductive layer 131, the second conductive layer 132, the second conductive layer 134, the second conductive layer 135, and the second conductive layer 136. Therefore, when the first conductive layer 141, the first conductive layer 142, the first conductive layer 145, and the first conductive layer 146 are removed, regions of the first conductive layer 121, the first conductive layer 122, the first conductive layer 124, the first conductive layer 125, and the first conductive layer 126 which extend beyond the side ends of the second conductive layer 131, the second conductive layer 132, the second conductive layer 134, the second conductive layer 135, and the second conductive layer 136 are also removed. Accordingly, the first conductive layer 121c, the first conductive layer 122c, the first conductive layer 124c, the first conductive layer 125c, and the first conductive layer 126c are formed.

Note that the first conductive layer 121c and the second conductive layer 131, the first conductive layer 122c and the second conductive layer 132, the first conductive layer 124c and the second conductive layer 134, the first conductive layer 125c and the second conductive layer 135, and the first conductive layer 126c and the second conductive layer 136 each function as a gate electrode.

In order to activate the impurity element, thermal treatment, intense light irradiation, or laser light irradiation may be performed. At the same time as the activation, plasma damage to the gate insulating layer and plasma damage to the interface between the gate insulating layer and the semiconductor layer can be repaired.

Next, a first interlayer insulating film is formed so as to cover the gate electrodes and the gate insulating layer. In this embodiment, a stacked structure of an insulating film 167 and an insulating film 168 is employed (see FIG. 9B). A silicon nitride oxide film having a thickness of 200 nm is formed as the insulating film 167, and a silicon oxynitride film having a thickness of 800 nm is formed as the insulating film 168 to form a stacked structure. Furthermore, the first interlayer insulating film may have a three-layer stacked structure in which a silicon oxynitride film having a thickness of 50 nm, a silicon nitride oxide film having a thickness of 140 nm, and a silicon oxynitride film having a thickness of 800 nm are formed so as to cover the gate electrodes and the gate insulating layer.

The insulating film 167 and the insulating film 168 can each be formed with, for example, an insulating film such as a silicon nitride film, a silicon nitride oxide film, a silicon oxynitride film, or a silicon oxide film using a sputtering method or a plasma CVD method. Furthermore, a single film of silicon including another element or a stacked structure of three or more layers thereof may be used. In this embodiment, the insulating film 167 and the insulating film 168 are successively formed using a plasma CVD method.

Furthermore, heat treatment is performed at 300° C. to 550° C. for 1 hour to 12 hours in a nitrogen atmosphere, whereby the semiconductor layers are hydrogenated. The heat treatment is preferably performed at 400° C. to 500° C. By this step, dangling bonds in the semiconductor layers are terminated by hydrogen contained in the insulating film 167 that is an interlayer insulating film. In this embodiment, heat treatment is performed at 410° C.

The insulating film 167 and the insulating film 168 can also be formed using a material selected from substances including aluminum nitride (AlN), aluminum oxynitride (AlON), aluminum nitride oxide containing more nitrogen than oxygen (AlNO), aluminum oxide, diamond-like carbon (DLC), nitrogen-containing carbon (CN), polysilazane, and another inorganic insulating material. Alternatively, a siloxane resin may be used. Further, an organic insulating material such as polyimide, acrylic, polyamide, polyimide amide, resist, or benzocyclobutene may also be used. Still alternatively, an oxazole resin can be used, and for example, photosensitive polybenzoxazole or the like can be used. Photosensitive polybenzoxazole has a low dielectric constant (a dielectric constant of 2.9 at 1 MHz at room temperature), high heat resistance (a thermal decomposition temperature of 550° C. with a rise in temperature of 5° C./min, which is measured with a thermogravimetric analyzer (TGA)), and a low water absorption (0.3% at room temperature in 24 hours). A coating film with a favorable planarity formed by a coating method may be used.

Next, contact holes (openings) that reach the semiconductor layers are formed in the insulating film 167, the insulating film 168, and the gate insulating layer 107, using a resist mask. Etching may be performed once or a plurality of times depending on etching selectivity between materials used. By removing the insulating film 167, the insulating film 168, and the gate insulating layer 107, openings are formed so as to reach the second impurity region 144a, the second impurity region 144b, the second impurity region 147a, and the second impurity region 147c which are n-type impurity regions and the second impurity region 160a, the second impurity region 160b, the second impurity region 163a, and the second impurity region 163b which are p-type impurity regions.

An etching method for forming openings may be either wet etching or dry etching, or may be a combination of the both. As an etching gas, a chlorine-based gas typified by $Cl_2$, $BCl_3$, $SiCl_4$, or $CCl_4$, a fluorine-based gas typified by $CF_4$, $SF_6$, or $NF_3$, or $O_2$ can be used as appropriate. Further, an inert gas may be added to the etching gas used. As an inert element to be added, one or plural elements selected from He, Ne, Ar, Kr, and Xe can be used.

Next, a conductive film is formed so as to cover the openings and is then etched, whereby a source electrode 169a, a drain electrode 169b, a source electrode 170a, a drain electrode 170b, a source electrode 171a, a drain electrode 171b, a source electrode 172a, and a drain electrode 172b are formed so as to be each electrically connected to part of the source or drain region.

The source electrode or drain electrode can be formed in such a manner that a conductive film is formed by a PVD method, a CVD method, an evaporation method, or the like and then etched into a desired shape. Alternatively, a conductive layer can be selectively formed in a predetermined position by a droplet discharging method, a printing method, an electroplating method, or the like. A reflow method, a damascene method, or the like may also be used. The source electrode or drain electrode can be formed using a metal such as Ag, Au, Cu, Ni, Pt, Pd, Ir, Rh, W, Al, Ta, Mo, Cd, Zn, Fe, Ti, Si, Ge, Zr, or Ba, or an alloy or a nitride thereof. Alternatively, a stacked structure of these materials may be used. In this embodiment, titanium (Ti) is formed to be 100 nm thick, an alloy of aluminum and silicon (Al—Si) is formed to be 700 nm thick, and titanium (Ti) is formed to be 200 nm thick, and then, the stacked film is processed into a desired shape.

Through the above-described process, an active matrix substrate provided with a transistor 173 and a transistor 174 in a peripheral driver circuit region 204 and a transistor 175 and a transistor 176 in a pixel region 206 can be manufactured (see FIG. 9C).

The active matrix substrate can be used for a light-emitting device including a self-light-emitting element, a liquid crystal display device including a liquid crystal element, and other display devices. In addition, the active matrix substrate can be used for semiconductor devices such as various processors typified by a central processing unit (CPU) and a card incorporating an ID chip.

The structure of the transistor is not limited to that described in this embodiment, and a single-gate structure in which one channel formation region is formed, a double-gate structure in which two channel formation regions are formed, or a triple-gate structure in which three channel formation regions are formed may be employed. Further, the transistor in the peripheral driver circuit region may also have a single-gate structure, a double-gate structure, or a triple-gate structure.

Next, an insulating film 181 and an insulating film 182 are formed as a second interlayer insulating film (see FIG. 10A). FIGS. 10A and 10B illustrate a manufacturing process of the display device, and a separation region 201 for separation by scribing, an external terminal connection region 202 to which an FPC is attached, a wiring region 203 that is a lead wiring region for the peripheral portion, the peripheral driver circuit region 204, and the pixel region 206 are provided. A wiring 179a and a wiring 179b are provided in the wiring region 203, and a terminal electrode layer 178 connected to an external terminal is provided in the external terminal connection region 202. Note that the wiring 179a, the wiring 179b, and the terminal electrode layer 178 are manufactured in the same step as the source electrodes and the drain electrodes.

The insulating film 181 and the insulating film 182 can be formed using a material selected from substances including silicon oxide, silicon nitride, silicon oxynitride, silicon nitride oxide, aluminum nitride (AlN), aluminum oxide containing nitrogen (also referred to as aluminum oxynitride) (AlON), aluminum nitride containing oxygen (also referred to as aluminum nitride oxide) (AlNO), aluminum oxide, diamond-like carbon (DLC), nitrogen-containing carbon (CN), phosphosilicate glass (PSG), borophosphosilicate glass (BPSG), alumina, and another inorganic insulating material. Alternatively, a siloxane resin may be used. Further, a photosensitive or non-photosensitive organic insulating material such as polyimide, acrylic, polyamide, polyimide amide, resist, benzocyclobutene, polysilazane, or a low dielectric constant (low-k) material can also be used. Still alternatively, an oxazole resin can be used, and for example, photosensitive polybenzoxazole or the like can be used. Photosensitive polybenzoxazole has a low dielectric constant (a dielectric constant of 2.9 at 1 MHz at room temperature), high heat resistance (a thermal decomposition temperature of 550° C. with a rise in temperature of 5° C./min, which is measured with a thermogravimetric analyzer (TGA)), and a low water absorption (0.3% at room temperature in 24 hours).

An interlayer insulating film provided for planarization is required to have high heat resistance, a high insulating property, and a high level of planarity. Thus, the insulating film 181 is preferably formed by a coating method typified by a spin coating method. In this embodiment, the insulating film 181 is formed with a coating film using a siloxane resin material, and the insulating film 182 is formed with a silicon nitride oxide film using a CVD method.

The insulating film 181 and the insulating film 182 can also be formed by a dipping method, spray coating, a doctor knife, a roll coater, a curtain coater, a knife coater, a CVD method, an evaporation method, or the like. The insulating film 181 and the insulating film 182 may be formed by a droplet discharging method. In the case of using a droplet discharging method, a material solution can be saved. In addition, a method by which a pattern can be transferred or drawn, like a droplet discharging method, for example, a printing method (a method by which a pattern can be formed, such as screen printing or offset printing), or the like can be used.

Next, as illustrated in FIG. 10B, openings are formed in the insulating film 181 and the insulating film 182 which are an interlayer insulating film. The insulating film 181 and the insulating film 182 need to be etched over a large area in a connection region 205 (see FIG. 12A), the peripheral driver circuit region 204, the wiring region 203, the external terminal connection region 202, the separation region 201, and the like. Note that the connection region 205 is a region illustrated in a top view in FIG. 12A, where wiring a layer manufactured in the same step as the source and drain electrodes and a second electrode layer that later serves as an upper electrode layer of a light-emitting element are electrically connected to each other. The connection region 205 is omitted and not illustrated in FIGS. 10A and 10B. An opening needs to be formed in the insulating film 181 and the insulating film 182 in the connection region 205. On the other hand, in the pixel region 206, an opening area is much smaller than an opening area in the peripheral driver circuit region 204 and the like, and is minute. Therefore, by carrying out both a photolithography step for forming the opening in the pixel region and a photolithography step for forming the opening in the connection region, a margin of etching conditions can be wide. As a result, yield can be improved. Further, with a wide margin of the etching conditions, the contact hole in the pixel region can be formed with high precision.

Specifically, a large-area opening is formed in the insulating film 181 and the insulating film 182 provided in the connection region 205, the peripheral driver circuit region 204, the wiring region 203, the external terminal connection region 202, and the separation region 201. For forming the openings, a mask is formed so as to cover the insulating film 181 and the insulating film 182 in the pixel region 206 and non-opening regions of the connection region 205, the peripheral driver circuit region 204, the wiring region 203, and the external terminal connection region 202. Etching can be performed by using a parallel plate RIE apparatus or an ICP etching apparatus. Note that etching time may be determined so that the wiring layers and the insulating film 168 are over-etched. Under the conditions where the wiring layers and the insulating film are over-etched, variation in thickness within the substrate and variation in etching rate can be reduced. In this manner, an opening is formed in each of the connection region 205, the peripheral driver circuit region 204, the wiring region 203, the external terminal connection region 202, and the separation region 201. An opening 183 is formed in the external terminal connection region 202, and the terminal electrode layer 178 is exposed.

After that, a minute opening, that is, a contact hole is formed in the insulating film 181 and the insulating film 182 in the pixel region 206. At this time, a mask is formed so as to cover the insulating film 181 and the insulating film 182 in a non-opening region of the pixel region 206, and in the connection region 205, the peripheral driver circuit region 204, the wiring region 203, and the external terminal connection region 202. The mask is used for forming the opening in the pixel region 206 and is provided with a minute opening at a predetermined position. As such a mask, for example, a resist mask can be used.

Then, the insulating film 181 and the insulating film 182 are etched by using a parallel plate RIE apparatus. Note that etching time may be determined so that the wiring layers and the insulating film 168 are over-etched. Under the conditions where the wiring layers and the insulating film 168 are over-etched, variation in thickness within the substrate and variation in etching rate can be reduced.

Further, an ICP apparatus may be used as the etching apparatus. By the aforementioned steps, an opening 184 which reaches the drain electrode 172b is formed in the pixel region 206 (see FIG. 10B).

The etching for forming the opening may be performed plural times at the same position. For example, since the opening of the connection region 205 has a large area, the amount to be etched is large. Such an opening with a large area may be formed by performing etching plural times. In addition, in the case of forming a deeper opening than other openings, etching may be performed plural times, similarly.

Moreover, in this embodiment, although an example of forming the openings in the insulating film 181 and the insulating film 182 by performing etching plural times is described, the openings may be formed in a single etching step. In this case, etching is performed using an ICP apparatus with an ICP power of 7000 W, a bias power of 1000 W, a pressure of 0.8 pascals (Pa), and 240 sccm of $CF_4$ and 160 sccm of $O_2$ as an etching gas. The bias power is preferably in the range of 1000 W to 4000 W. Since the openings can be formed in a single etching step, there is an advantage that the process can be simplified.

In the case where all the openings in the insulating film 181 and the insulating film 182 are formed in a single step, a mask layer formed using a light exposure mask having a light-intensity reducing function or a light exposure mask capable of transmitting light with a plurality of intensities may be used as described in the above embodiment. With such a light exposure mask, a mask layer having regions with different thicknesses can be formed. Thus, it is possible to form a mask layer thick in a region where the opening is shallow like the opening 184 and form a mask layer thin in a region where the opening is deep like the opening 183. When a mask layer having a gradient in thickness depending on the desired depth of etching is used, different depths of etching can be performed by a single etching step. Therefore, as the wiring layer or the like exposed in the shallow opening is not subjected to etching treatment for a long time, damage to the wiring layer by excessive over-etching can be prevented.

Next, a first electrode layer 185 (also referred to as a pixel electrode layer) is formed so as to be in contact with the drain electrode 172b. The first electrode layer 185 functions as an anode or a cathode and may be formed using a film containing, as its main component, an element such as Ti, Ni, W, Cr, Pt, Zn, Sn, In, or Mo, an alloy material or a compound material containing the above element as its main component such as titanium nitride, titanium silicon nitride, tungsten silicide, tungsten nitride, tungsten silicon nitride, or niobium nitride, or a stacked film thereof with a total thickness of 100 nm to 800 nm.

In this embodiment, the first electrode layer 185 has a light-transmitting property because a light-emitting element is used as a display element and light from the light-emitting element is extracted through the first electrode layer 185. The first electrode layer 185 is formed by forming a transparent conductive film and etching the transparent conductive film into a desired shape (see FIG. 11A). In this embodiment, the insulating film 182 functions as an etching stopper as well when the first electrode layer 185 is formed by etching a transparent conductive film into a desired shape thereover.

In the present invention, specifically, the first electrode layer 185 that is a light-transmitting electrode layer may be formed using a transparent conductive film of a light-transmitting conductive material, and indium oxide containing tungsten oxide, indium zinc oxide containing tungsten oxide, indium oxide containing titanium oxide, indium tin oxide containing titanium oxide, or the like can be used. Of course, indium oxide, indium tin oxide (ITO), indium zinc oxide (IZO (registered trademark)), indium tin oxide to which silicon oxide is added (ITSO), zinc oxide, zinc oxide to which gallium is added, graphene, or the like can also be used.

In addition, even in the case of using a non-light-transmitting material like a metal film, when the thickness is made small (preferably, from 5 nm to 30 nm) so as to be able to transmit light, light can be emitted through the first electrode layer 185. As a metal material that can be used for the first electrode layer 185, a conductive film formed of titanium, tungsten, nickel, gold, platinum, silver, aluminum, magnesium, calcium, lithium, chromium, molybdenum, iron, cobalt, copper, palladium, or an alloy thereof, or the like can be used. Alternatively, a nitride of the metal material (such as titanium nitride) or the like may be used.

The first electrode layer 185 can be formed using an evaporation method, a sputtering method, a CVD method, a printing method, a droplet discharging method, or like. In this embodiment, the first electrode layer 185 is formed by a sputtering method using indium zinc oxide containing tungsten oxide. The first electrode layer 185 is preferably formed with a total thickness of 100 nm to 800 nm, and the thickness is 125 nm in this embodiment.

The first electrode layer 185 may be cleaned and polished by a CMP method or with the use of a polyvinylalcohol-based porous material so that the surface thereof is planarized. In addition, after polishing by a CMP method, ultraviolet light irradiation, oxygen plasma treatment, or the like may be performed on the surface of the first electrode layer 185.

After the first electrode layer 185 is formed, heat treatment may be performed. By this heat treatment, moisture contained in the first electrode layer 185 is released. Accordingly, degasification of the first electrode layer 185 or the like does not occur. Thus, even when a light-emitting material that is easily deteriorated by moisture is formed over the first electrode layer, the light-emitting material is not deteriorated; therefore, a highly reliable display device can be manufactured.

Next, an insulating layer 186 (also referred to as a partition wall or a barrier) is formed so as to cover the end portion of the first electrode layer 185 and the source electrode or drain electrode (see FIG. 11B). In addition, in the same step, an insulating layer 187a and an insulating layer 187b are formed in the external terminal connection region 202.

When the selectivity of the insulating layer 186 to the first electrode layer 185 is high, the first electrode layer 185 functions as an etching stopper during etching into a desired shape for forming the insulating layer 186 which functions as a partition wall covering part of the first electrode layer 185.

The insulating layer 186 can be formed using silicon oxide, silicon nitride, silicon oxynitride, aluminum oxide, aluminum nitride, aluminum oxynitride, or other inorganic insulating materials, acrylic acid, methacrylic acid, or a derivative thereof, a heat-resistance high molecular compound such as polyimide, aromatic polyamide, or polybenzimidazole, or a siloxane resin. Further, it is also possible to use a photosensitive or non-photosensitive material such as acrylic or polyimide. Still alternatively, an oxazole resin can be used, and for example, photosensitive polybenzoxazole or the like can be used. Photosensitive polybenzoxazole has a low dielectric constant (a dielectric constant of 2.9 at 1 MHz at room temperature), high heat resistance (a thermal decomposition temperature of 550° C. with a rise in temperature of 5° C./min, which is measured with a thermogravimetric analyzer (TGA)), and a low water absorption (0.3% at room temperature in 24 hours). It is preferable to form the insulating layer 186 so as to have a continuously changing radius of curvature, and thus coverage with an electroluminescent (EL) layer 188 and a second electrode layer 189 formed thereover is improved.

Figure 12A:
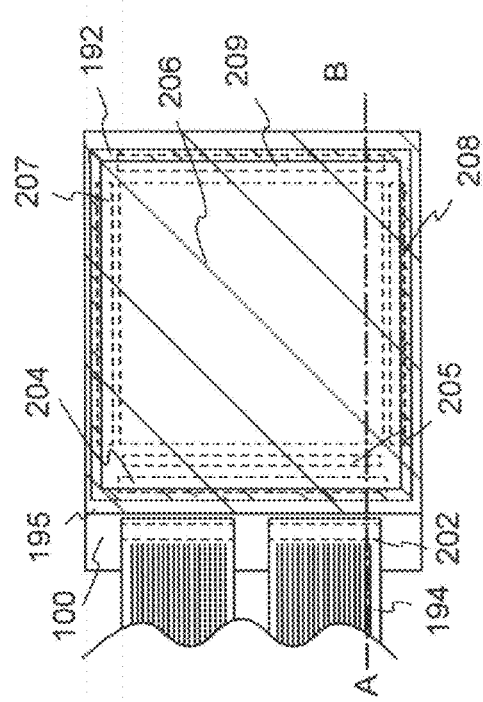
FIGS. 12A and 12B are a top view and a cross-sectional view of a display device of the present invention.

In the connection region 205 illustrated in FIG. 12A, a wiring layer formed of the same material and in the same step as those of the second electrode layer is electrically connected to a wiring layer formed of the same material and in the same step as those of the gate electrode. For this connection, an opening is formed so as to expose the wiring layer formed of the same material and in the same step as those of the gate electrode. By covering a step in the periphery of the opening with the insulating layer 186 so as to smooth the step, the coverage with the second electrode layer 189 stacked thereover can be improved.

In addition, in order to further improve reliability, it is preferable to carry out degasification by vacuum heating before forming the EL layer 188. For example, it is desirable that heat treatment in a reduced pressure atmosphere or an inert gas atmosphere at 200° C. to 400° C., preferably 250° C. to 350° C. be performed to remove a gas contained in the substrate, before evaporation of an organic compound material is performed. Moreover, it is preferable to form the EL layer 188 by a vacuum evaporation method or a droplet discharging method under a reduced pressure without exposing the substrate to an atmosphere. Through this heat treatment, moisture contained in or adhering to the conductive film to be the first electrode layer or the insulating layer (the partition wall) can be discharged. This heat treatment can double as the prior heating treatment if the substrate can be transferred in a vacuum chamber without breaking the vacuum, and may be carried out once after forming the insulating layer (partition wall). Here, by forming the interlayer insulating film and the insulating layer (partition wall) using a highly heat resistant substance, a heat treatment step for improving the reliability can be sufficiently carried out.

The EL layer 188 is formed over the first electrode layer 185. Although only one pixel is illustrated in FIG. 12B, electroluminescent layers corresponding to R (red), G (green), and B (blue) are formed in this embodiment.

Materials (such as low-molecular or high-molecular materials) which exhibit light emission of red (R), green (G), and blue (B) can also be formed by a droplet discharging method.

Next, the second electrode layer 189 formed with a conductive film is provided over the EL layer 188. In this embodiment, the second electrode layer 189 is provided on the side opposite to the light extraction side and is therefore formed using a reflective material. As the reflective material, a metal material such as aluminum, gold, platinum, silver, nickel, tungsten, chromium, molybdenum, iron, cobalt, copper, or palladium can be used. Besides, an alloy containing aluminum (an aluminum alloy) such as an alloy of aluminum and titanium, an alloy of aluminum and nickel, or an alloy of aluminum and neodymium, or an alloy containing silver such as an alloy of silver and copper can be used. The alloy of silver and copper is preferable because it has high heat resistance. In this manner, a light-emitting element 190 including the first electrode layer 185, the EL layer 188, and the second electrode layer 189 is formed (see FIG. 12B).

Figure 12B:
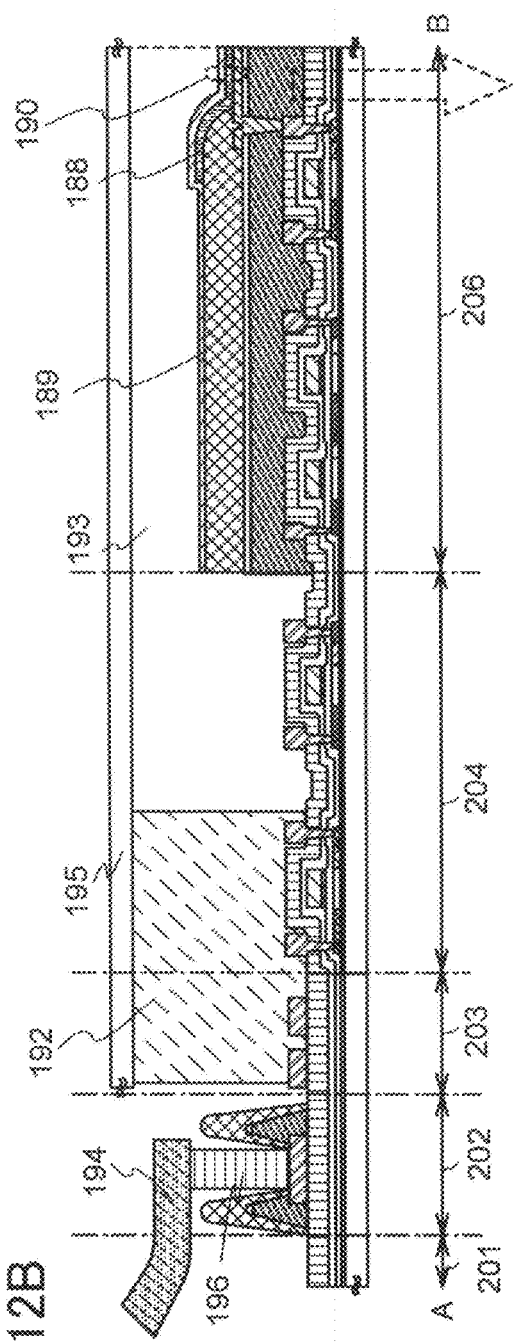

In the display device of this embodiment illustrated in FIGS. 12A and 12B, light from the light-emitting element 190 is transmitted through the first electrode layer 185 and emitted in the direction indicated by an arrow in FIG. 12B.

In this embodiment, an insulating layer may be provided as a passivation film (a protective film) over the second electrode layer 189. It is effective to provide a passivation film so as to cover the second electrode layer 189 as described above. The passivation film may be formed using an insulating film containing silicon nitride, silicon oxide, silicon oxynitride (SiON), silicon nitride oxide (SiNO), aluminum nitride (AlN), aluminum oxynitride (AlON), aluminum nitride oxide (AlNO) containing more nitrogen than oxygen, aluminum oxide, diamond-like carbon (DLC), or nitrogen-containing carbon (CN), and a single layer or a stacked layer of the insulating films can be used. Alternatively, a siloxane resin may be used.

At this time, it is preferable to form the passivation film using a film with which favorable coverage is obtained, and it is effective to use a carbon film, particularly, a DLC film for the passivation film. A DLC film can be formed at a temperature range from room temperature to 100° C.; therefore, it can also be formed easily over the EL layer 188 which has low heat resistance. A DLC film can be formed by a plasma CVD method (typically, an RF plasma CVD method, a microwave CVD method, an electron cyclotron resonance (ECR) CVD method, a hot filament CVD method, or the like), a combustion method, a sputtering method, an ion beam evaporation method, a laser evaporation method, or the like. As reaction gases for film formation, a hydrogen gas and a hydrocarbon-based gas (such as $CH_4$, $C_2H_2$, or $C_6H_6$) are used, and the gases are ionized by glow discharge, and the ions are accelerated to collide with a cathode to which a negative self-bias is applied. Further, a CN film may be formed with the use of a $C_2H_4$ gas and a $N_2$ gas as reaction gases. A DLC film has high blocking effect against oxygen; therefore, oxidization of the EL layer 188 can be suppressed. Accordingly, a problem such as oxidation of the EL layer 188 during a sealing step which is performed later can be avoided.

A substrate 100, over which the light-emitting element 190 is formed as described above, and a sealing substrate 195 are firmly attached to each other with a sealing material 192, whereby the light-emitting element is sealed (see FIGS. 12A and 12B). In the display device of the present invention, the sealing material 192 and the insulating layer 186 are formed apart so as not to be in contact with each other. By forming the sealing material 192 and the insulating layer 186 apart from each other, even when an insulating material which contains a highly hygroscopic organic material is used for the insulating layer 186, moisture does not easily enter and the deterioration of the light-emitting element can be prevented, whereby the reliability of the display device can be improved. As the sealing material 192, typically, a visible light curable resin, an ultraviolet light curable resin, or a thermosetting resin is preferably used. For example, a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis type epoxy resin, a glycidyl ester resin, a glycidyl amine-based resin, a heterocyclic epoxy resin, a modified epoxy resin, or the like can be used. Note that a region surrounded by the sealing material 192 may be filled with a filler 193 or the region may be filled with nitrogen or the like by performing sealing in a nitrogen atmosphere. Since a bottom-emission structure is employed in this embodiment, the filler 193 does not need to have a light-transmitting property. However, in a structure where light is extracted through the filler 193, the filler needs to have a light-transmitting property. Typically, a visible light curable epoxy resin, an ultraviolet light curable epoxy resin, or a thermosetting epoxy resin may be used. Through the aforementioned steps, the display device having a display function and including the light-emitting element of this embodiment is completed. Further, the filler may be dripped in a liquid state to fill a space inside the display device.

In this embodiment, in the external terminal connection region 202, the terminal electrode layer 178 is connected to an FPC 194 through an anisotropic conductive layer 196 and electrically connected to an external portion. In addition, as illustrated in FIG. 12A that is a top view of the display device, the display device manufactured in this embodiment includes a peripheral driver circuit region 207 and a peripheral driver circuit region 208 each including a scan line driver circuit, in addition to the peripheral driver circuit region 204 and the peripheral driver circuit region 209 each including a signal line driver circuit.

The circuit as described above is used in this embodiment; however, the present invention is not limited thereto. An IC chip may be mounted as the peripheral driver circuit by the aforementioned COG method or TAB method. Further, one or more gate line driver circuits and source line driver circuits may be provided.

In the display device of the present invention, a driving method for image display is not particularly limited, and for example, a dot sequential driving method, a line sequential driving method, an area sequential driving method, or the like may be used. Typically, a line sequential driving method may be used, and a time division gray scale driving method or an area gray scale driving method may be used as appropriate. Furthermore, a video signal input to the source lines of the display device may be an analog signal or a digital signal. The driver circuit and the like may be designed as appropriate in accordance with the video signal.

Further, in a display device using a digital video signal, a video signal which is input to a pixel has a constant voltage (CV) or a constant current (CC). With regard to a video signal with a constant voltage (CV), voltage which is applied to a light-emitting element is constant (CVCV), or current which flows through a light-emitting element is constant (CVCC). Further, with regard to a video signal with a constant current (CC), voltage which is applied to a light-emitting element is constant (CCCV), or current which flows through a light-emitting element is constant (CCCC).

In this embodiment, the first impurity regions and the second impurity regions can be formed at the same time by a single doping; thus, a reduction in the number of light exposure masks and a simplification of the manufacturing process can be achieved. Accordingly, an increase in productivity can be achieved.

In this embodiment, in the drain region, the first impurity region having a maximum of the impurity concentration distribution in the depth direction at a deeper position is in contact with the channel formation region, and the second impurity region having a maximum of the impurity concentration distribution in the depth direction at a shallower position is in contact with the drain electrode.

Since the maximum of the impurity concentration distribution in the first impurity region in the depth direction is away from an end of the gate electrode, the off-state current of the transistor can be reduced. In addition, the electric field near the drain can be reduced, and deterioration due to hot-carrier injection can be prevented.

Furthermore, since the second impurity region having the maximum of the impurity concentration distribution in the depth direction at a shallower position is in contact with the drain electrode, a favorable electrical connection can be established between the drain region and the drain electrode without an increase in contact resistance.

As described above, a transistor with reduced off-state current can be manufactured. Thus, by using the transistor, a highly reliable semiconductor device can be provided. In addition, a reduction of power consumption of a semiconductor device can be achieved.

Note that this embodiment can be implemented in an appropriate combination with any of the configurations described in the other embodiments.

Embodiment 3

In this embodiment, an example of an element structure of the light-emitting element 190 described in Embodiment 2 will be described.

Figure 16A:
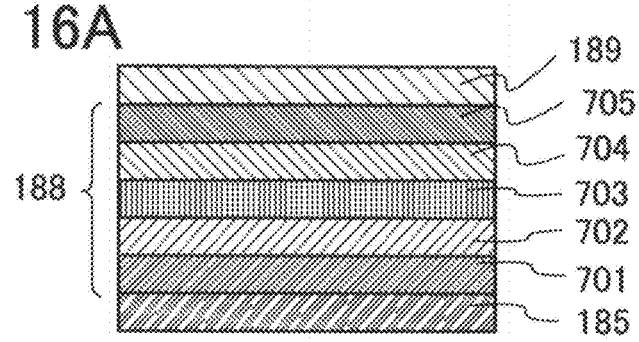
FIGS. 16A to 16C are cross-sectional views each illustrating an example of a light-emitting element used for a display device of the present invention.

A light-emitting element illustrated in FIG. 16A includes a first electrode layer 185, an EL layer 188 over the first electrode layer 185, and a second electrode layer 189 over the EL layer 188.

The EL layer 188 includes at least a light-emitting layer containing a light-emitting organic compound. The EL layer 188 can have a stacked structure in which the layer containing a light-emitting organic compound is combined with a layer containing a substance having a high electron-transport property, a layer containing a substance having a high hole-transport property, a layer containing a substance having a high electron-injection property, a layer containing a substance having a high hole-injection property, a layer containing a bipolar substance (a substance having a high electron-transport property and a high hole-transport property), and the like as appropriate. In this embodiment, in the EL layer 188, a hole-injection layer 701, a hole-transport layer 702, a light-emitting layer 703, an electron-transport layer 704, and an electron-injection layer 705 are stacked in this order from the first electrode layer 185 side.

A method for manufacturing the light-emitting element illustrated in FIG. 16A will be described.

First, the first electrode layer 185 is formed. The first electrode layer 185 can be formed as described in Embodiment 2; therefore, detailed description is omitted here.

Next, the EL layer 188 is formed over the first electrode layer 185. In this embodiment, the EL layer 188 includes the hole-injection layer 701, the hole-transport layer 702, the light-emitting layer 703, the electron-transport layer 704, and the electron-injection layer 705.

The hole-injection layer 701 is a layer that contains a substance having a high hole-injection property. Examples of the substance having a high hole-injection property which can be used are metal oxides, such as molybdenum oxide, titanium oxide, vanadium oxide, rhenium oxide, ruthenium oxide, chromium oxide, zirconium oxide, hafnium oxide, tantalum oxide, silver oxide, tungsten oxide, and manganese oxide. Other examples of the substance which can be used are phthalocyanine-based compounds, such as phthalocyanine (abbreviation: H$_2$Pc) and copper(II) phthalocyanine (abbreviation: CuPc).

Other examples of the substance which can be used are aromatic amine compounds which are low molecular organic compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Still other examples of the substance which can be used are high molecular compounds (e.g., oligomers, dendrimers, and polymers), such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-M-phenylamino}phenyl)methacrylamide] (abbreviation: PTPDMA), and poly[N,N'-bis(4-butylphenyl)-N,N'-bis(phenyl)benzidine] (abbreviation: Poly-TPD), and high molecular compounds to which acid is added, such as poly(3,4-ethylenedioxythiophene)/poly(styrenesulfonic acid) (PEDOT/PSS), or polyaniline/poly(styrenesulfonic acid) (PAni/PSS).

In particular, as the hole-injection layer 701, a composite material in which an organic compound having a high hole-transport property contains an acceptor substance is preferably used. With the use of the composite material in which a substance having a high hole-transport property contains an acceptor substance, an excellent hole-injection property from the first electrode layer 185 can be obtained, which results in a reduction in drive voltage of the light-emitting element. A composite material of these substances can be formed by co-evaporation of a substance having a high hole-transport property and an acceptor substance. When the hole-injection layer 701 is formed using the composite material, holes are easily injected from the first electrode layer 185 into the EL layer 188.

Examples of the organic compound used for the composite material can be a variety of compounds, such as aromatic amine compounds, carbazole derivatives, aromatic hydrocarbons, and high molecular compounds (e.g., oligomers, dendrimers, and polymers). The organic compound used for the composite material is preferably an organic compound having a high hole-transport property, and is specifically preferably a substance having a hole mobility of $10^{-6}$ cm$^2$Ns or more. Note that other than these substances, any substance that has a property of transporting more holes than electrons may be used. Organic compounds that can be used for the composite material will be specifically described below.

Examples of the organic compound that can be used for the composite material are aromatic amine compounds, such as TDATA, MTDATA, DPAB, DNTPD, DPA3B, PCzPCA1, PCzPCA2, PCzPCN1,4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole derivatives, such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Other examples of the organic compound that can be used are aromatic hydrocarbon compounds, such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Other examples of the organic compound that can be used are aromatic hydrocarbon compounds, such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

Further, examples of the electron acceptor are organic compounds, such as 7,7,8,8-tetracyano-2,3,5,6-tetrafluoro quino dimethane (abbreviation: F$_4$-TCNQ) and chloranil, oxides of transition metals, and oxides of metals that belong to Groups 4 to 8 in the periodic table, and the like. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is especially preferable since it is stable in the air, has a low hygroscopic property, and is easy to handle.

The composite material may be formed using the above-described electron acceptor and the above-described high molecular compound such as PVK, PVTPA, PTPDMA, or Poly-TPD, and may be used for the hole-injection layer 701.

The hole-transport layer 702 is a layer that contains a substance having a high hole-transport property. Examples of the substance having a high hole-transport property are aromatic amine compounds such as NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly substances that have a hole mobility of $10^{-6}$ cm$^2$/Vs or more. Note that other than these substances, any substance that has a property of transporting more holes than electrons may be used. Note that the layer containing a substance having a high hole-transport property is not limited to a single layer, and may be a stack of two or more layers containing any of the above substances.

For the hole-transport layer 702, a carbazole derivative such as CBP, CzPA, or PCzPA or an anthracene derivative such as t-BuDNA, DNA, or DPAnth may be used.

For the hole-transport layer 702, a high molecular compound such as PVK, PVTPA, PTPDMA, or Poly-TPD can also be used.

The light-emitting layer 703 is a layer that contains a light-emitting organic compound. As the light-emitting organic compound, for example, a fluorescent compound which emits fluorescence or a phosphorescent compound which emits phosphorescence can be used.

Examples of the fluorescent compound that can be used for the light-emitting layer 703 are the following light-emitting materials: materials that emit blue light, such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA); materials that emit green light, such as N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA); materials that emit yellow light, such as rubrene and 5,12-bis(1,1'-biphenyl-4-yl)-6,11-diphenyltetracene (abbreviation: BPT); and materials that emit red light, such as N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-diamine (abbreviation: p-mPhAFD).

Examples of the phosphorescent compound that can be used for the light-emitting layer 703 are the following light-emitting materials: materials that emit blue light, such as bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis{2-[3',5'-bis(trifluoromethyl)phenyl]pyridinato-N,C$^{2'}$}iridium(III)picolinate (abbreviation: Ir(CF$_3$ ppy)$_2$(pic)), and bis[2-(4',6'-difluorophenyl)pyridinato-N,C$^{2'}$]iridium(III)acetylacetonate (abbreviation: FIr(acac)); materials that emit green light, such as tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$); materials that emit yellow light, such as bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)); materials that emit orange light, such as tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)$_2$(acac)), and (acetylacetonato)bis(5-isopropyl-3-methyl-2-phenylpyrazinato)iridium(III) (abbreviation: Ir(mppr-iPr)$_2$(acac)); and materials that emit red light, for example, organometallic complexes, such as bis[2-(2'-benzo[4,5-α]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and (2,3,7,8,12,13,17,18-octaethyl-21H,23H-porphyrin)platinum(II) (abbreviation: PtOEP). Any of the following rare earth metal complexes can be used as the phosphorescent compound: tris(acetylacetonato)(monophenanthroline)terbium(III) (abbreviation: Tb(acac)$_3$(Phen)); tris(1,3-diphenyl-1,3-propanedionato)(monophenanthroline)europium(III) (abbreviation: Eu(DBM)$_3$(Phen)); and tris[1-(2-thenyl)-3,3,3-trifluoroacetonato](monophenanthroline)europium(III) (abbreviation: Eu(TTA)$_3$(Phen)), because their light emission is from rare earth metal ions (electronic transition between different multiplicities) in such a rare earth metal complex.

Note that the light-emitting layer 703 may have a structure in which any of the above-described light-emitting organic compounds (a guest material) is dispersed in another substance (a host material). A variety of substances can be used as the host material, and it is preferable to use a substance having a lowest unoccupied molecular orbital level (LUMO level) higher than that of a light-emitting substance and having a highest occupied molecular orbital level (HOMO level) lower than that of the light-emitting substance.

Specific examples of the host material that can be used are the following materials: metal complexes, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds, such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; aromatic amine compounds, such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2- anthryl)-N,9-diphenyl-9H-carbazol-3-amine (abbreviation: 2PCAPA), NPB (or α-NPD), TPD, DFLDPBi, and BSPB; and the like.

Plural kinds of host materials can also be used. For example, in order to suppress crystallization, a substance such as rubrene, which suppresses crystallization, may be further added. In addition, NPB, Alq, or the like may be further added in order to efficiently transfer energy to the guest material.

With a structure in which a guest material is dispersed in a host material, crystallization of the light-emitting layer 703 can be suppressed. In addition, concentration quenching due to high concentration of the guest material can also be suppressed.

For the light-emitting layer 703, a high molecular compound can be used. Specific examples of blue light-emitting materials are poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), and the like. Specific examples of green light-emitting materials are poly(p-phenylenevinylene) (abbreviation: PPV), poly[(9,9-dihexylfluorene-2,7-diyl)-alt-co-(benzo[2,1,3] thiadiazole-4,7-diyl)] (abbreviation: PFBT), poly[(9,9-dioctyl-2,7-divinylenefluorenylene)-alt-co-(2-methoxy-5-(2-ethylhexyloxy)-1,4-phenylene)], and the like. Specific examples of orange to red light-emitting materials are poly [2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis (N,N'-diphenylamino)-1,4-phenylene]} (abbreviation: CN-PPV-DPD), and the like.

Note that the light-emitting layer may have a stacked-layer structure including two or more layers. When the light-emitting layer has a stacked-layer structure including two or more layers and the kind of light-emitting substance for each light-emitting layer is changed, various emission colors can be obtained. In addition, when a plurality of light-emitting substances which emit light of different colors is used as the light-emitting substance, light emission having a broad spectrum or white light emission can also be obtained. In particular, a lighting device, for which high luminance is necessary, preferably has a structure in which light-emitting layers are stacked.

The electron-transport layer 704 is a layer that contains a substance having a high electron-transport property. Examples of the substance having a high electron-transport property are metal complexes having a quinoline skeleton or a benzoquinoline skeleton, such as tris(8-quinolinolato)aluminum (abbreviation: Alq), tris(4-methyl-8-quinolinolato) aluminum (abbreviation: Almq$_3$), bis(10-hydroxybenzo[h] quinolinato)beryllium (abbreviation: BeBq$_2$), and bis(2-methyl-8-quinolinolato)(4-phenylphenolato)aluminum (abbreviation: BAlq). Other examples are metal complexes having an oxazole-based or thiazole-based ligand, such as bis[2-(2-hydroxyphenyl)benzoxazolato]zinc (abbreviation: Zn(BOX)$_2$) and bis[2-(2-hydroxyphenyl)benzothiazolato] zinc (abbreviation: Zn(BTZ)$_2$). Other than metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can be used. The substances mentioned here are mainly substances having an electron mobility of $10^{-6}$ cm$^2$/Vs or more. Further, the electron-transport layer is not limited to a single layer, and may be a stack of two or more layers containing any of the above substances.

The electron-injection layer 705 is a layer that contains a substance having a high electron-injection property. Examples of the substance that can be used for the electron-injection layer 705 are alkali metals, alkaline earth metals, and compounds thereof, such as lithium, cesium, calcium, lithium fluoride, cesium fluoride, calcium fluoride, and lithium oxide, rare earth metal compounds, such as erbium fluoride, and the above-mentioned substances used for the electron-transport layer 704.

Note that the hole-injection layer 701, the hole-transport layer 702, the light-emitting layer 703, the electron-transport layer 704, and the electron-injection layer 705 which are mentioned above can each be formed by a method, such as an evaporation method (including a vacuum evaporation method), an inkjet method, or a coating method.

Figure 16B:
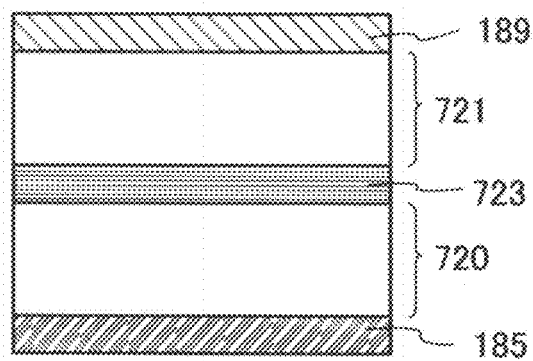

A plurality of EL layers may be stacked between the first electrode layer 185 and the second electrode layer 189 as illustrated in FIG. 16B. In that case, a charge-generation layer 723 is preferably provided between a first EL layer 720 and a second EL layer 721 which are stacked. The charge-generation layer 723 can be formed using the above-described composite material. Further, the charge-generation layer 723 may have a stacked structure including a layer containing the composite material and a layer containing another material. In that case, as the layer containing another material, a layer containing an electron-donating substance and a substance with a high electron-transport property, a layer formed of a transparent conductive film, or the like can be used. As for a light-emitting element having such a structure, problems such as energy transfer and quenching hardly occur, and a light-emitting element which has both high emission efficiency and a long lifetime can be easily obtained due to a wider choice of materials. Moreover, a light-emitting element which provides phosphorescence from one of the EL layers and fluorescence from the other of the EL layers can be readily obtained. This structure can be combined with any of the above-described structures of the EL layer.

When the charge-generation layer 723 is provided between the stacked EL layers as illustrated in FIG. 16B, the element can have high luminance and a long lifetime while the current density is kept low. In addition, the voltage drop due to resistance of the electrode material can be reduced, whereby uniform light emission over a large area is possible.

In the case of a stacked-type element in which two EL layers are stacked, when the emission colors obtained from the first and second EL layers are complementary to each other, white light emission can be extracted to the outside. Note that white light emission can also be obtained with a structure where each of the first and second EL layers includes a plurality of light-emitting layers emitting light of complementary colors. Examples of complementary colors include blue and yellow, blue-green and red, and the like. A substance which emits light of blue, yellow, blue green, or red may be selected as appropriate from, for example, the light-emitting substances given above.

An example of a light-emitting element having a structure in which a plurality of EL layers is stacked is described below. First, an example of the structure in which each of the first and second EL layers includes a plurality of light-emitting layers emitting light of complementary colors and from which white light emission can be obtained is described.

For example, the first EL layer includes a first light-emitting layer that emits light having an emission spectrum with a peak in the blue to blue-green wavelength range, and a second light-emitting layer that emits light having an emission spectrum with a peak in the yellow to orange wavelength range; the second EL layer includes a third light-emitting layer that emits light having an emission spectrum with a peak in the blue-green to green wavelength range, and a fourth light-emitting layer that emits light having an emission spectrum with a peak in the orange to red wavelength range.

In that case, a light emission from the first EL layer is a combination of light emissions from both the first light-emitting layer and the second light-emitting layer, and thus exhibits an emission spectrum with peaks both in the blue to blue-green wavelength range and in the yellow to orange wavelength range. That is, the first EL layer emits light of two-wavelength type white or a two-wavelength type color close to white.

Further, a light emission from the second EL layer is a combination of light emissions from both the third light-emitting layer and the fourth light-emitting layer, and thus exhibits an emission spectrum with peaks both in the blue-green to green wavelength range and in the orange to red wavelength range. That is, the second EL layer emits light of two-wavelength type white or a two-wavelength type color close to white, which is different from the light emitted from the first EL layer.

Thus, a combination of the light emissions from the first EL layer and the second EL layer can provide a light emission of white which covers the wavelength ranges of blue to blue-green, blue-green to green, yellow to orange, and orange to red.

Further, the yellow to orange wavelength range (greater than or equal to 560 nm and less than 580 nm) is a wavelength range of high luminosity; thus, application of an EL layer which includes a light-emitting layer having an emission spectrum peak in the yellow to orange wavelength range is useful. For example, a structure can be used in which a first EL layer which includes a light-emitting layer having an emission spectrum peak in the blue wavelength range, a second EL layer which includes a light-emitting layer having an emission spectrum peak in the yellow wavelength range, and a third EL layer which includes a light-emitting layer having an emission spectrum peak in the red wavelength range are stacked.

Further, two or more EL layers emitting yellow to orange light may be stacked. When two or more EL layers emitting yellow to orange light are stacked, the power efficiency of the light-emitting element can be further improved.

For example, in the case of a light-emitting element in which three EL layers are stacked, a structure can be used in which a second EL layer and a third EL layer each including a light-emitting layer having an emission spectrum peak in the yellow to orange wavelength range are stacked over a first EL layer including a light-emitting layer having an emission spectrum peak in the blue wavelength range (greater than or equal to 400 nm and less than 480 nm). Note that the wavelength of the peak of the emission spectrum from the second EL layer may be the same as or different from that from the third EL layer.

The use of the EL layer emitting light having an emission spectrum peak in the yellow to orange wavelength range makes it possible to utilize a wavelength range of high luminosity and to improve power efficiency. Thus, the power efficiency of the whole light-emitting element can be increased. Such a structure is advantageous in terms of luminosity and can improve power efficiency in comparison with the case where, for example, an EL layer which emits green light and an EL layer which emits red light are stacked to obtain a light-emitting element which emits yellow to orange light. Further, the emission intensity of light in the blue wavelength range of low luminosity is relatively low in comparison with the case where only one EL layer emitting light having a spectrum peak in the yellow to orange wavelength range of high luminosity is used; thus, the color of emitted light is close to incandescent color (or warm white), and the power efficiency is improved.

In other words, in the above light-emitting element, the color of light which is obtained by combining light whose emission spectrum peak is in the yellow to orange wavelength range and whose wavelength at the peak is greater than or equal to 560 nm and less than 580 nm and light whose emission spectrum peak is in the blue wavelength range (i.e., the color of light emitted from the light-emitting element) can be a natural color like warm white or incandescent color. In particular, incandescent color can be easily obtained.

For example, an organometallic complex in which a pyrazine derivative serves as a ligand can be used as the light-emitting substance which emits light having an emission spectrum peak in the yellow to orange wavelength range. Alternatively, the light-emitting layers can be formed by dispersing a light-emitting substance (a guest material) in another substance (a host material). A phosphorescent compound can be used as the light-emitting substance which emits light having a peak in the yellow to orange wavelength range. The power efficiency in the case of using a phosphorescent compound is three to four times as high as that in the case of using a fluorescent compound. The above organometallic complex, in which a pyrazine derivative serves as a ligand, is a phosphorescent compound, has high emission efficiency, and easily emits light in the yellow to orange wavelength range, and is thus favorable.

For example, a pyrenediamine derivative can be used as the light-emitting substance which emits light having a peak in the blue wavelength range. A fluorescent compound can be used as the light-emitting substance which emits light having a peak in the blue wavelength range. The use of a fluorescent compound makes it possible to obtain a light-emitting element which has longer lifetime than a light-emitting element in which a phosphorescent compound is used. The above pyrenediamine derivative is a fluorescent compound, can have extremely high quantum efficiency, and has long lifetime, and is thus favorable.

Figure 16C:
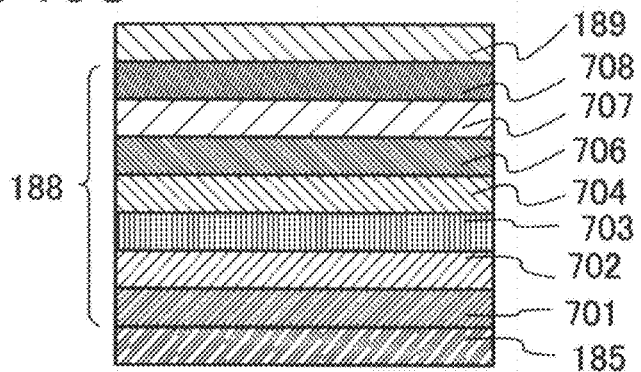

As illustrated in FIG. 16C, the EL layer may include the hole-injection layer 701, the hole-transport layer 702, the light-emitting layer 703, the electron-transport layer 704, an electron-injection buffer layer 706, an electron-relay layer 707, and a composite material layer 708 which is in contact with the second electrode layer 189, between the first electrode layer 185 and the second electrode layer 189.

It is preferable to provide the composite material layer 708 which is in contact with the second electrode layer 189, in which case damage caused to the EL layer 188 particularly when the second electrode layer 189 is formed by a sputtering method can be reduced. The composite material layer 708 can be formed using the above-described composite material in which an organic compound having a high hole-transport property contains an acceptor substance.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

For the electron-injection buffer layer 706, a substance having a high electron-injection property, such as an alkali metal, an alkaline earth metal, a rare earth metal, a compound of the above metal (e.g., an alkali metal compound (e.g., an oxide such as lithium oxide, a halide, and a carbonate such as lithium carbonate or cesium carbonate), an alkaline earth metal compound (e.g., an oxide, a halide, and a carbonate), or a rare earth metal compound (e.g., an oxide, a halide, and a carbonate), can be used.

Further, in the case where the electron-injection buffer layer 706 contains a substance having a high electron-transport property and a donor substance, the donor substance is preferably added so that the mass ratio of the donor substance to the substance having a high electron-transport property is in the range from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate). Note that as the substance having a high electron-transport property, a material similar to the material for the electron-transport layer 704 described above can be used.

Furthermore, it is preferable that the electron-relay layer 707 be formed between the electron-injection buffer layer 706 and the composite material layer 708. The electron-relay layer 707 is not necessarily provided; however, by providing the electron-relay layer 707 having a high electron-transport property, electrons can be rapidly transported to the electron-injection buffer layer 706.

The structure in which the electron-relay layer 707 is sandwiched between the composite material layer 708 and the electron-injection buffer layer 706 is a structure in which the acceptor substance contained in the composite material layer 708 and the donor substance contained in the electron-injection buffer layer 706 are less likely to interact with each other, and thus their functions hardly interfere with each other. Therefore, an increase in drive voltage can be suppressed.

The electron-relay layer 707 contains a substance having a high electron-transport property and is formed so that the LUMO level of the substance having a high electron-transport property is located between the LUMO level of the acceptor substance contained in the composite material layer 708 and the LUMO level of the substance having a high electron-transport property contained in the electron-transport layer 704. In the case where the electron-relay layer 707 contains a donor substance, the donor level of the donor substance is also controlled so as to be located between the LUMO level of the acceptor substance contained in the composite material layer 708 and the LUMO level of the substance having a high electron-transport property contained in the electron-transport layer 704. As a specific value of the energy level, the LUMO level of the substance having a high electron-transport property contained in the electron-relay layer 707 is preferably higher than or equal to −5.0 eV, more preferably higher than or equal to −5.0 eV and lower than or equal to −3.0 eV.

As the substance having a high electron-transport property contained in the electron-relay layer 707, a phthalocyanine-based material or a metal complex having a metal-oxygen bond and an aromatic ligand is preferably used.

As the phthalocyanine-based material contained in the electron-relay layer 707, specifically, any of CuPc, a phthalocyanine tin(II) complex (SnPc), a phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc), is preferably used.

As the metal complex having a metal-oxygen bond and an aromatic ligand, which is contained in the electron-relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex having a metal-oxygen double bond is considered stable. Thus, the use of the metal complex having the metal-oxygen double bond enables the light-emitting element to be driven more stably at low voltage.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is likely to act on another molecule in terms of a molecular structure and an acceptor property is high.

Note that as the phthalocyanine-based materials mentioned above, a phthalocyanine-based material having a phenoxy group is preferable. Specifically, a phthalocyanine derivative having a phenoxy group, such as PhO-VOPc, is preferable. The phthalocyanine derivative having a phenoxy group is soluble in a solvent and therefore has the advantage of being easy to handle during formation of a light-emitting element and the advantage of facilitating maintenance of an apparatus used for film formation.

The electron-relay layer 707 may further contain a donor substance. As the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). When such a donor substance is contained in the electron-relay layer 707, electrons can be transferred easily and the light-emitting element can be driven at lower voltage.

In the case where a donor substance is contained in the electron-relay layer 707, other than the materials given above as the substance having a high electron-transport property, a substance having a LUMO level higher than the acceptor level of the acceptor substance contained in the composite material layer 708 can be used. Specifically, it is preferable to use a substance having a LUMO level higher than or equal to −5.0 eV, preferably higher than or equal to −5.0 eV and lower than or equal to −3.0 eV. As examples of such a substance, a perylene derivative, a nitrogen-containing condensed aromatic compound, and the like are given. Note that a nitrogen-containing condensed aromatic compound is preferably used for the electron-relay layer 707 because of its high stability.

Specific examples of the perylene derivative are 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), N,N'- dihexyl-3,4,9,10-perylenetetracarboxylic diimide (abbreviation: Hex PTC), and the like.

Specific examples of the nitrogen-containing condensed aromatic compound are pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8,8-pentadecafluorooctyl)-1,4,5,8-naphthalenetetracar boxylic diimide (abbreviation: NTCDI-C8F), 3',4'-dibutyl-5,5"-bis(dicyanomethylene)-5,5"-dihydro-2,2':5',2"-terthiophene (abbreviation: DCMT), methanofullerenes (e.g., [6,6]-phenyl C$_{61}$ butyric acid methyl ester), or the like can be used.

Note that in the case where a donor substance is contained in the electron-relay layer 707, the electron-relay layer 707 may be formed by a method such as co-evaporation of the substance having a high electron-transport property and the donor substance.

The hole-injection layer 701, the hole-transport layer 702, the light-emitting layer 703, and the electron-transport layer 704 may each be formed using the above-described materials.

Then, the second electrode layer 189 is formed over the EL layer 188. The second electrode layer 189 can be formed as described in Embodiment 2; therefore, detailed description is omitted here.

Through the above process, a light-emitting element including the EL layer between the first electrode layer 185 and the second electrode layer 189 can be manufactured.

Note that this embodiment can be implemented in an appropriate combination with any of the other embodiments.

Embodiment 4

A display device including a light-emitting element can be manufactured by applying the present invention, and light emission from the light-emitting element is any one of bottom emission, top emission, and dual emission. In this embodiment, examples of a dual-emission type and a top-emission type will be described with reference to FIGS. 13A and 13B. Note that the light-emitting element 190 of Embodiment 2 or 3 can be applied to the light-emitting element of this embodiment.

The display device illustrated in FIG. 13B includes an element substrate 1300, a transistor 1355, a transistor 1365, a transistor 1375, a transistor 1385, a wiring layer 1324a, a wiring layer 1324b, a first electrode layer 1317, an EL layer 1319, a second electrode layer 1320, a filler 1322, a sealing material 1325, an insulating film 1301b, a gate insulating layer 1310, an insulating film 1311, an insulating film 1312, an insulating layer 1314, a sealing substrate 1323, a wiring layer 1345a, a wiring layer 1345b, a terminal electrode layer 1381a, a terminal electrode layer 1381b, an anisotropic conductive layer 1382, and an FPC 1383. The display device includes an external terminal connection region 222, a wiring region 223, a peripheral driver circuit region 224, and a pixel region 226. The filler 1322 can be formed by a dropping method using a composition in a liquid state. The element substrate 1300 where the filler is formed by a dropping method and the sealing substrate 1323 are attached to each other, and the display device is sealed.

Wiring layers (each functioning as a source electrode or a drain electrode) connected to the transistor 1355, the transistor 1365, the transistor 1375, and the transistor 1385 have a two-layer structure. The wiring layer 1324a and the wiring layer 1324b are also stacked. The wiring layer 1324b extends beyond an end portion of the wiring layer 1324a. The wiring layer 1324b and the first electrode layer 1317 are formed so as to be in contact with each other. Moreover, in the wiring region 223, end portions of the gate insulating layer 1310, the insulating film 1311, and the insulating film 1312 are etched into tapered shapes, and the end portions are covered with the wiring layer 1345a and the wiring layer 1345b.

The display device of FIG. 13B is of a dual-emission type, in which light is emitted to both the element substrate 1300 side and the sealing substrate 1323 side in the directions indicated by arrows. Thus, a light-transmitting conductive material may be used for each of the first electrode layer 1317 and the second electrode layer 1320. Even in the case of using a non-light-transmitting material like a metal film, when the thickness is made small (preferably, approximately 5 nm to 30 nm) so as to be able to transmit light, light can be emitted through the first electrode layer 1317 and the second electrode layer 1320.

As the light-transmitting conductive material, a material similar to that of the first electrode layer 185 described in Embodiment 2 can be used; therefore, detailed description is omitted here.

For the EL layer 1319, a material similar to that of the EL layer described in Embodiment 3 can be used; therefore, detailed description is omitted here.

As described above, in the display device of FIG. 13B, light emitted from a light-emitting element 1305 is transmitted through both the first electrode layer 1317 and the second electrode layer 1320, whereby light is emitted to both sides.

In the display device of FIG. 13B, the wiring layer 1324a as a drain electrode of the transistor 1355 and the first electrode layer 1317 of the light-emitting element as a pixel electrode layer are not electrically connected to each other by being stacked directly. Instead, the wiring layer 1324a and the first electrode layer 1317 are electrically connected to each other through the wiring layer 1324b which is formed under the wiring layer 1324a. With such a structure, even when the wiring layer 1324a and the first electrode layer 1317 are formed of materials which are not easily electrically connected by direct contact or materials which cause deterioration such as electric corrosion when in contact with each other, such materials can be used since the wiring layer 1324b is interposed therebetween. As a result, there is a wider choice of materials for the wiring layer 1324a and the first electrode layer 1317. As a problem caused by stacking the wiring layer 1324a and the first electrode layer 1317 does not need to be taken into consideration, a material having characteristics required for each of the wiring layer 1324a, or the drain electrode, and the first electrode layer 1317 can be freely selected. Therefore, a display device with higher functionality and higher reliability can be manufactured with high yield. A display device of FIG. 13A also has a similar connection between the drain electrode and the first electrode layer.

The display device of FIG. 13A has a structure of a top-emission type in which light is emitted from a light-emitting element 1605 in the direction indicated by an arrow. The display device illustrated in FIG. 13A includes an element substrate 1600, a transistor 1655, a transistor 1665, a transistor 1675, a transistor 1685, a wiring layer 1624a, a wiring layer 1624b, a first electrode layer 1617, an EL layer 1619, a second electrode layer 1620, a protective film 1621, a filler 1622, a sealing material 1625, an insulating film 1601b, a gate insulating layer 1610, an insulating film 1611, an insulating film 1612, an insulating layer 1614, a sealing substrate 1623, a wiring layer 1633*a*, a wiring layer 1633*b*, a terminal electrode layer 1681*a*, a terminal electrode layer 1681*b*, an anisotropic conductive layer 1682, and an FPC 1683.

In the display device of FIG. 13A, the insulating layers stacked over the terminal electrode layer 1681*b* are removed by etching. With such a structure as in FIGS. 13A and 13B where an insulating layer having a moisture permeable property is not provided in the periphery of the terminal electrode layer, reliability is further improved. In addition, the display device includes an external terminal connection region 232, a wiring region 233, a peripheral driver circuit region 234, and a pixel region 236. Moreover, in the wiring region 233, end portions of the gate insulating layer 1610, the insulating film 1611, and the insulating film 1612 are etched into tapered shapes, and the end portions are covered with the wiring layer 1633*a* and the wiring layer 1633*b*.

In the display device of FIG. 13A, the wiring layer 1624*b* which is a reflective metal layer is formed under the first electrode layer 1317 in the above-described dual-emission type display device illustrated in FIG. 13B. The first electrode layer 1617 which is a transparent conductive film is formed over the wiring layer 1624*b*.

For the first electrode layer 1617 and the second electrode layer 1620, a material similar to that of the first electrode layer 185 described in Embodiment 2 can be used; therefore, detailed description is omitted here.

For the wiring layer 1624*b*, a reflective material may be used, and a material similar to that of the second electrode layer 189 described in Embodiment 2 can be used; therefore, detailed description is omitted here.

For the EL layer 1619, a material similar to that of the EL layer described in Embodiment 3 can be used; therefore, detailed description is omitted here.

Note that in order to obtain such a top-emission type display device as illustrated in FIG. 13A, a reflective metal material may be used for the first electrode layer 1617, in which case the wiring layer 1624*b* that is a reflective metal layer does not necessarily need to be provided.

In the case where a reflective metal material is used for the first electrode layer 1617, the light-emitting element 1605 is preferably formed using a composite material in which an organic compound contains a metal oxide.

Between the first electrode layer which has a reflective property and a film provided thereover and including a composite material, a film containing a light-transmitting conductive metal oxide is formed. By stacking the film containing a light-transmitting conductive metal oxide so as to be in contact with the first electrode layer having a reflective property, a decrease in light extraction efficiency of the light-emitting element can be avoided. In addition, by stacking the film containing a light-transmitting conductive metal oxide so as to be in contact with the first electrode layer having a reflective property, oxidation of the first electrode layer can be suppressed and favorable hole-injection from the first electrode layer to the EL layer can be ensured.

For example, for the first electrode layer 1617, a reflective metal material such as aluminum or titanium or an alloy material including the reflective metal material can be used.

As the film containing a light-transmitting conductive metal oxide, a film containing titanium, molybdenum, tungsten, or a metal oxide thereof (titanium oxide, molybdenum oxide, or tungsten oxide) can be used. The thickness of the film containing a light-transmitting conductive metal oxide is preferably from 3 nm to 10 nm, and may typically be from 5 nm to 7 nm. In addition, the film containing a light-transmitting conductive metal oxide may be a single layer of a film including the above material or a stacked layer thereof, and for example, a titanium film, a titanium oxide film, a tungsten oxide film, a stacked layer of a titanium film and a titanium oxide film, or the like can be used. The above materials are preferable because they are present in large amounts in the Earth's crust and inexpensive and thus a reduction in the cost of manufacturing a light-emitting element can be achieved. Among them, aluminum and titanium are further preferable because they are abundant materials in the Earth's crust.

In addition, for the film containing a light-transmitting conductive metal oxide, indium oxide containing tungsten oxide, indium zinc oxide containing tungsten oxide, indium oxide containing titanium oxide, indium tin oxide containing titanium oxide, or the like can be used. Of course, indium oxide, indium tin oxide (ITO), indium zinc oxide (IZO (registered trademark)), indium tin oxide to which silicon oxide is added (ITSO), zinc oxide, zinc oxide to which gallium is added, graphene, or the like can also be used.

In the film containing the composite material in which an organic compound contains a metal oxide, as the metal oxide, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is especially preferable since it is stable in the air, has a low hygroscopic property, and is easy to handle. The thickness of the film containing the composite material in which an organic compound contains a metal oxide is preferably from 30 nm to 200 nm, more preferably, from 50 nm to 100 nm.

In addition, in the case where a reflective metal material is used for the first electrode layer 1617, it is preferable that the first electrode layer 1617 has a stacked-layer structure of a film of an aluminum alloy (an alloy containing aluminum, such as an alloy of aluminum and titanium, an alloy of aluminum and nickel, or an alloy of aluminum and neodymium, or the like) and a metal film or a metal oxide film containing titanium, titanium oxide, or the like as a material, and that the light-emitting element 1605 is formed using a composite material in which an organic compound contains a metal oxide. This is because, by forming a film containing a metal or a metal oxide over an aluminum alloy film, oxidation of the aluminum alloy can be suppressed and favorable hole injection from the first electrode layer to the EL layer can be ensured, and thus, a reduction in drive voltage of the light-emitting element can be achieved. In addition, hole injection from the first electrode layer to the EL layer 188 can be facilitated.

Accordingly, a transistor with reduced off-state current can be manufactured, and by using the transistor, a highly reliable semiconductor device can be provided.

Note that this embodiment can be implemented in an appropriate combination with any of the configurations described in the other embodiments.

Embodiment 5

A semiconductor device disclosed in this specification can be applied to a variety of electronic devices (including an amusement machine). Examples of electronic devices are a television device (also referred to as a television or a television receiver), a monitor of a computer or the like, a digital camera, a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

In this embodiment, examples of electronic devices incorporating transistors with favorable electrical characteristics and high reliability which can be obtained in any of the above embodiments will be described with reference to FIGS. 14A to 14E.

Figure 14A:
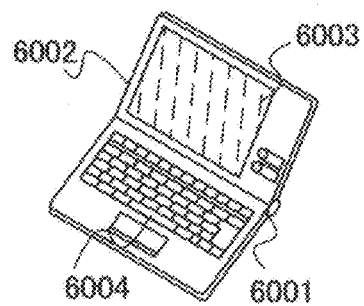
FIGS. 14A to 14E illustrate electronic devices to which the present invention is applied.

FIG. 14A illustrates a notebook personal computer, which includes a housing 6001, a housing 6002, a display portion 6003, a keyboard 6004, and the like. Note that the notebook personal computer includes any of the transistors described in the above embodiments. Therefore, the notebook personal computer with favorable quality and high reliability can be realized.

Figure 14D:
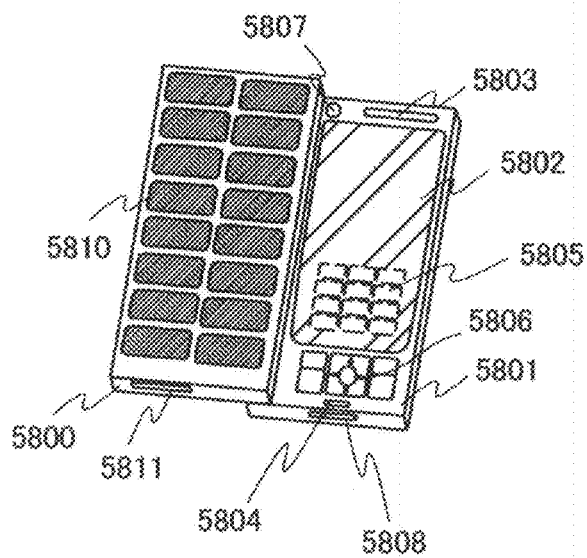
Figure 14B:
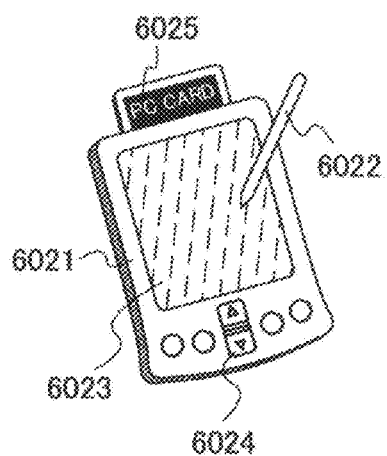

FIG. 14B illustrates a portable information terminal (PDA). A main body 6021 is provided with a display portion 6023, an external interface 6025, operation buttons 6024, and the like. Further, a stylus 6022 for operation of the portable information terminal, or the like is provided. Note that the portable information terminal (PDA) includes any of the transistors described in the above embodiments. Therefore, the portable information terminal (PDA) with favorable quality and high reliability can be realized.

Figure 14E:
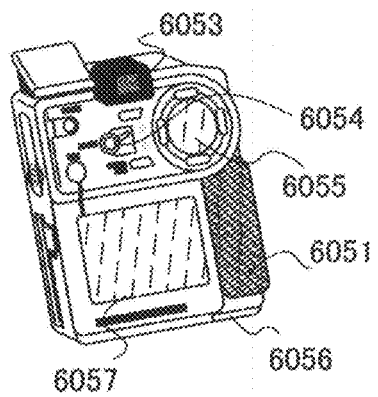
Figure 14C:
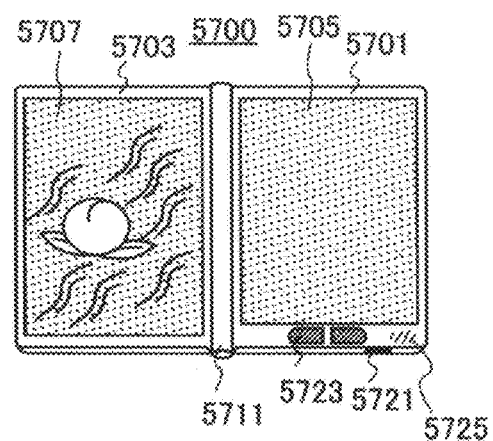

FIG. 14C illustrates an electronic book incorporating electronic paper as a component. FIG. 14C illustrates an example of an electronic book. For example, an electronic book 5700 includes two housings, a housing 5701 and a housing 5703. The housing 5701 and the housing 5703 are combined by a hinge 5711 so that the electronic book 5700 can be opened and closed with the hinge 5711 used as an axis. With such a structure, the electronic book 5700 can be operated like a paper book.

A display portion 5705 is incorporated in the housing 5701 and a display portion 5707 is incorporated in the housing 5703. The display portion 5705 and the display portion 5707 may display one image or different images. When the display portions display different images, text can be displayed on the right display portion (the display portion 5705 in FIG. 14C) and an image can be displayed on the left display portion (the display portion 5707 in FIG. 14C), for example.

Further, FIG. 14C illustrates an example where the housing 5701 is provided with an operation portion and the like. For example, the housing 5701 is provided with a power switch 5721, operation keys 5723, a speaker 5725, and the like. Pages can be turned with the operation keys 5723. Note that a keyboard, a pointing device, or the like may be provided on the same side as the display portion in the housing. Moreover, an external connection terminal (e.g., an earphone terminal, a USB terminal, and a terminal connectable to an AC adapter and a variety of cables such as a USB cable), a recording media insertion portion, or the like may be provided on a rear surface or a side surface of the housing. Furthermore, the electronic book 5700 may function as an electronic dictionary.

In addition, the electronic book 5700 may be configured to be able to wirelessly transmit and receive information. The electronic book 5700 can have a structure where desired book data or the like are wirelessly purchased and downloaded from an electronic book server.

FIG. 14D illustrates a mobile phone, which includes two housings, a housing 5800 and a housing 5801. The housing 5801 includes a display panel 5802, a speaker 5803, a microphone 5804, a pointing device 5806, a camera lens 5807, an external connection terminal 5808, and the like. In addition, the housing 5801 includes a solar cell 5810 having a function of charging the mobile phone, an external memory slot 5811, and the like. Further, an antenna is incorporated in the housing 5801. Note that the mobile phone includes any of the transistors described in the above embodiments at least as a component.

Further, the display panel 5802 includes a touch panel. A plurality of operation keys 5805 which is displayed as an image is indicated by dashed lines in FIG. 14D. Note that a boosting circuit by which a voltage output from the solar cell 5810 is increased so as to be sufficient for each circuit is also included.

The display panel 5802 changes the orientation of display as appropriate in accordance with the application mode. Further, the camera lens 5807 is provided on the same side as the display panel 5802, so that the mobile phone can be used as a video phone. The speaker 5803 and the microphone 5804 can be used for videophone calls, recording, and playing sound, etc. as well as voice calls. Moreover, the housings 5800 and 5801 in a state where they are developed as illustrated in FIG. 14D can be slid so that one is lapped over the other. Therefore, the size of the mobile phone can be reduced, which makes the mobile phone suitable for being carried around.

The external connection terminal 5808 can be connected to an AC adaptor and a variety of cables such as a USB cable, and charging and data communication with a personal computer or the like are possible. Moreover, the mobile phone can store and transfer a larger amount of data by inserting a recording medium into the external memory slot 5811. As the recording medium, the semiconductor device described in Embodiment 1 can be used. With the use of a transistor with sufficiently reduced off-state current according to Embodiment 1, a semiconductor device capable of holding stored data for an extremely long time can be obtained.

Further, in addition to the above functions, an infrared communication function, a television reception function, or the like may be provided.

FIG. 14E illustrates a digital camera, which includes a main body 6051, a display portion (A) 6057, an eyepiece 6053, an operation switch 6054, a display portion (B) 6055, a battery 6056, and the like. Note that the digital camera includes any of the transistors described in the above embodiments. Therefore, the digital camera with favorable quality and high reliability can be realized.

Note that this embodiment can be implemented in an appropriate combination with any of the configurations described in the other embodiments.

Example

In this example, results of evaluating electrical characteristics of a p-type transistor in which the second impurity region 310*b* described in Embodiment 1 is formed in the step of adding an impurity element as illustrated in FIG. 3C and a p-type transistor in which the second impurity region 310*b* is not formed, through calculations using Sentaurus Device produced by Synopsys, Inc., will be described with reference to FIGS. 15A and 15B. Note that in FIGS. 15A and 15B, circle marks show results of calculations of the transistor in which the second impurity region 310*b* is formed, and cross marks show results of calculations of the transistor in which the second impurity region 310*b* is not formed.

The calculations were carried out assuming that the transistor in which the second impurity region 310*b* was formed and the transistor in which the second impurity region 310*b* was not formed each had the gate insulating film 303 of silicon oxide with a thickness of 20 nm, the semiconductor layer 302 of single crystal silicon with a thickness of 50 nm, a channel length of 3.6 μm, and a channel width of 10 μm. Note that the second conductive layer 305*c* illustrated in FIG.

3C was omitted. In addition, instead of carrying out calculations assuming that the first conductive layer 304a and the first conductive layer 304b illustrated in FIG. 3C were tantalum nitride films with a thickness of 30 nm, the calculations were carried out using silicon oxide films of the same shape with a thickness of 50 nm which was set by thickness conversion so that the films had an equivalent stopping power.

In addition, the calculation conditions for electrical characteristics evaluation were that the voltage applied between the source and drain electrodes was 3 V and the voltage applied to the gate electrode was in the range from −3 V to 3 V.

Figure 15A:
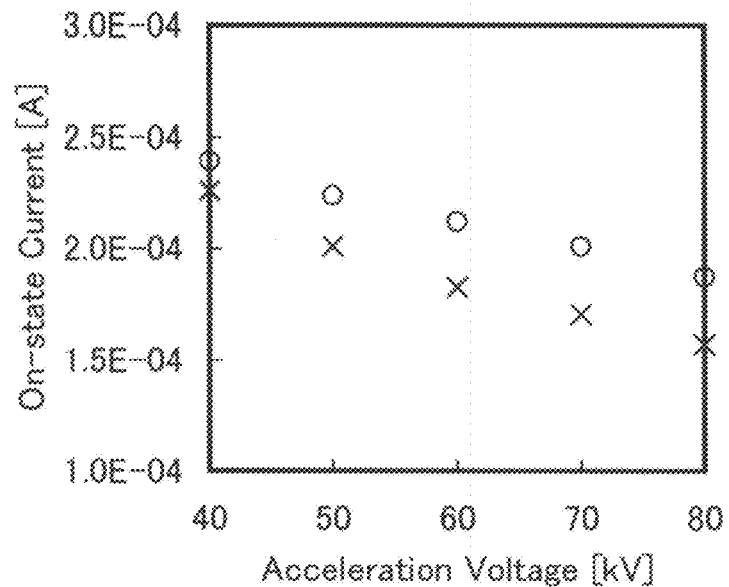
FIGS. 15A and 15B show results of calculating acceleration voltage vs. off-state current and acceleration voltage vs. on-state current.

FIG. 15A shows a correlation between acceleration voltage for adding an impurity element and on-state current. FIG. 15A reveals that as the acceleration voltage for adding an impurity element is changed so as to obtain higher acceleration conditions, the on-state current tends to decrease. It also reveals that the calculated on-state current of the transistor in which the second impurity region 310b is formed is larger than the calculated on-state current of the transistor in which the second impurity region 310b is not formed.

Figure 15B:
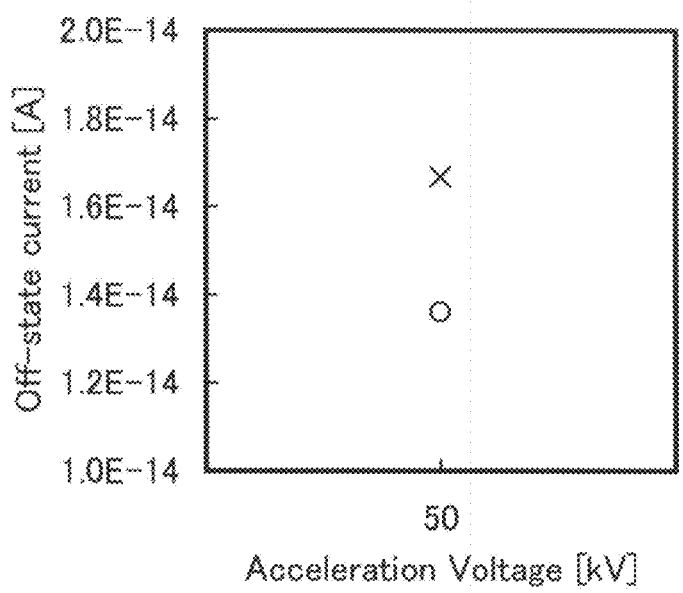

Next, FIG. 15B shows results of calculating off-state current. Here, as a typical example, the acceleration voltage for adding an impurity element is set to 50 kV. FIG. 15B reveals that the calculated off-state current of the transistor in which the second impurity region 310b is formed is smaller than the calculated off-state current of the transistor in which the second impurity region 310b is not formed.

The above findings mean that the transistor in which the second impurity region 310b is formed has a smaller off-state current than the transistor in which the second impurity region 310b is not formed.

In this example, the p-type transistors are used; it can be easily understood by those skilled in the art that similar results can be obtained with n-type transistors.

As described in Embodiment 1, it is found that it becomes possible to provide a transistor with high on-state current by forming the second impurity region 310b as compared with a manufacturing method in which the second impurity region 310b is not formed.

This application is based on Japanese Patent Application serial no. 2010-280670 filed with Japan Patent Office on Dec. 16, 2010, the entire contents of which are hereby incorporated by reference.

What is claimed is:

1. A method for manufacturing a semiconductor device, comprising the steps of:
   forming a semiconductor layer over an insulating surface;
   forming a gate insulating film over the semiconductor layer, the gate insulating film comprising a first gate insulating portion, a second gate insulating portion and a third gate insulating portion;
   forming a first conductive film over the gate insulating film;
   forming a second conductive film over the first conductive film;
   forming a first mask layer and a second mask layer over the second conductive film by using a light exposure mask configured to transmit light with a plurality of intensities;
   forming a first conductive layer overlapping a first region of the semiconductor layer and a second conductive layer over and in contact with the first conductive layer by etching the second conductive film and the first conductive film using the first mask layer, and a third conductive layer overlapping a second region of the semiconductor layer by etching the second conductive film and the first conductive film using the second mask layer; and
   adding an impurity element imparting one conductivity type to both the second region of the semiconductor layer and a third region of the semiconductor layer by using the first conductive layer, the second conductive layer, and the third conductive layer as a mask,
   wherein the first region of the semiconductor layer and the first gate insulating portion overlap each other,
   wherein the second region of the semiconductor layer and the second gate insulating portion overlap each other,
   wherein the third region of the semiconductor layer and the third gate insulating portion overlap each other,
   wherein the third gate insulating portion is positioned between the first gate insulating portion and the second gate insulating portion, and
   wherein the third gate insulating portion is exposed after forming the third conductive layer.

2. The method for manufacturing a semiconductor device according to claim 1, wherein the semiconductor layer is a single crystal semiconductor layer manufactured by irradiating a semiconductor substrate with accelerated ions to form an embrittled region in the semiconductor substrate, bonding the semiconductor substrate and a substrate to each other with an insulating layer interposed therebetween, and separating the semiconductor substrate along the embrittled region by heat treatment.

3. The method for manufacturing a semiconductor device according to claim 1,
   wherein the first mask layer comprises a first portion and a second portion, and
   wherein a thickness of the first portion is smaller than a thickness of the second portion.

4. The method for manufacturing a semiconductor device according to claim 3, wherein a percentage of the thickness of the first portion to the thickness of the second portion is 50% or less.

5. The method for manufacturing a semiconductor device according to claim 3, wherein the thickness of the first portion of the first mask layer is equal to or substantially equal to a thickness of the second mask layer.

6. The method for manufacturing a semiconductor device according to claim 1, wherein a thickness of the first conductive layer and a thickness of the third conductive layer are each in a range from 20 nm to 100 nm and a thickness of the second conductive layer is in a range from 100 nm to 400 nm.

7. The method for manufacturing a semiconductor device according to claim 1,
   wherein a maximum of an impurity concentration distribution in the third region of the semiconductor layer in a depth direction is closer to the insulating surface than a maximum of an impurity concentration distribution in the second region of the semiconductor layer in a depth direction.

8. The method for manufacturing a semiconductor device according to claim 1,
   wherein a thickness of the third gate insulating portion is smaller than a thickness of the second gate insulating portion.

9. The method for manufacturing a semiconductor device according to claim 1, further comprising the step of etching the first conductive layer and the third conductive layer to remove the third conductive layer and at least part of the first conductive layer.

10. A method for manufacturing a semiconductor device, comprising the steps of:
    forming a gate insulating film over a semiconductor region, the semiconductor region comprising a channel formation region, a first region, and a second region;

forming a first conductive film over the gate insulating film;
forming a second conductive film over the first conductive film;
forming a first mask layer over the second conductive film;
forming a first conductive layer and a second conductive layer over and in contact with the first conductive layer by etching the second conductive film and the first conductive film using the first mask layer;
forming a second mask layer by ashing the first mask layer;
forming a third conductive layer by etching the second conductive layer using the second mask layer; and
adding an impurity element imparting one conductivity type to both the first region and the second region by using the first conductive layer and the third conductive layer as a mask,
wherein the gate insulating film comprises a first gate insulating portion, a second gate insulating portion and a third gate insulating portion,
wherein the channel formation region and the first gate insulating portion overlap each other,
wherein the first region and the second gate insulating portion overlap each other,
wherein the second region and the third gate insulating portion overlap each other,
wherein the third gate insulating portion is positioned between the first gate insulating portion and the second gate insulating portion, and
wherein the third gate insulating portion is exposed after forming the third conductive layer.

11. The method for manufacturing a semiconductor device according to claim 10,
wherein a semiconductor layer comprises the semiconductor region.

12. The method for manufacturing a semiconductor device according to claim 11,
wherein the semiconductor layer is a single crystal semiconductor layer manufactured by irradiating a semiconductor substrate with accelerated ions to form an embrittled region in the semiconductor substrate, bonding the semiconductor substrate and a substrate to each other with an insulating layer interposed therebetween, and separating the semiconductor substrate along the embrittled region by heat treatment.

13. The method for manufacturing a semiconductor device according to claim 10,
wherein the first mask layer comprises a first portion and a second portion, and
wherein a thickness of the first portion is smaller than a thickness of the second portion.

14. The method for manufacturing a semiconductor device according to claim 13,
wherein a percentage of the thickness of the first portion to the thickness of the second portion is 50% or less.

15. The method for manufacturing a semiconductor device according to claim 10,
wherein a thickness of the first conductive layer is in a range from 20 nm to 100 nm and a thickness of the second conductive layer is in a range from 100 nm to 400 nm.

16. The method for manufacturing a semiconductor device according to claim 10,
wherein a maximum of an impurity concentration distribution in the second region wherein in a depth direction is further from a top surface of the semiconductor region than a maximum of an impurity concentration distribution in the first region in a depth direction.

17. The method for manufacturing a semiconductor device according to claim 16,
wherein a thickness of the third gate insulating portion is smaller than a thickness of the second gate insulating portion.

18. A method for manufacturing a semiconductor device, comprising the steps of:
forming a gate insulating film over a semiconductor region, the semiconductor region comprising a channel formation region, a first region, and a second region;
forming a first conductive film over the gate insulating film;
forming a second conductive film over the first conductive film;
forming a first mask layer over the second conductive film;
forming a first conductive layer and a second conductive layer over and in contact with the first conductive layer by etching the second conductive film and the first conductive film using the first mask layer;
forming a second mask layer by ashing the first mask layer;
forming a third conductive layer by etching the second conductive layer using the second mask layer;
adding an impurity element imparting one conductivity type to both the first region and the second region by using the first conductive layer and the third conductive layer as a mask; and
forming a fourth conductive layer by etching the first conductive layer using the third conductive layer as a mask,
wherein the gate insulating film comprises a first gate insulating portion, a second gate insulating portion and a third gate insulating portion,
wherein the channel formation region and the first gate insulating portion overlap each other,
wherein the first region and the second gate insulating portion overlap each other,
wherein the second region and the third gate insulating portion overlap each other,
wherein the third gate insulating portion is positioned between the first gate insulating portion and the second gate insulating portion, and
wherein the third gate insulating portion is exposed after forming the third conductive layer.

19. The method for manufacturing a semiconductor device according to claim 18,
wherein a semiconductor layer comprises the semiconductor region.

20. The method for manufacturing a semiconductor device according to claim 19,
wherein the semiconductor layer is a single crystal semiconductor layer manufactured by irradiating a semiconductor substrate with accelerated ions to form an embrittled region in the semiconductor substrate, bonding the semiconductor substrate and a substrate to each other with an insulating layer interposed therebetween, and separating the semiconductor substrate along the embrittled region by heat treatment.

21. The method for manufacturing a semiconductor device according to claim 18,
wherein the first mask layer comprises a first portion and a second portion, and
wherein a thickness of the first portion is smaller than a thickness of the second portion.

22. The method for manufacturing a semiconductor device according to claim 21,
wherein a percentage of the thickness of the first portion to the thickness of the second portion is 50% or less.

23. The method for manufacturing a semiconductor device according to claim 18, wherein a thickness of the first conductive layer is in a range from 20 nm to 100 nm and a thickness of the second conductive layer is in a range from 100 nm to 400 nm.

24. The method for manufacturing a semiconductor device according to claim 18,
wherein a maximum of an impurity concentration distribution in the second region in a depth direction is further from a top surface of the semiconductor region than a maximum of an impurity concentration distribution in the first region in a depth direction.

25. The method for manufacturing a semiconductor device according to claim 24,
wherein a thickness of the third gate insulating portion is smaller than a thickness of the second gate insulating portion.

* * * * *